United States Patent
Won et al.

(10) Patent No.: US 11,903,228 B2
(45) Date of Patent: Feb. 13, 2024

(54) CORE SHELL QUANTUM DOT AND ELECTRONIC DEVICE INCLUDING THE SAME

(71) Applicant: SAMSUNG ELECTRONICS CO., LTD., Suwon-si (KR)

(72) Inventors: Nayoun Won, Suwon-si (KR); Mi Hye Lim, Suwon-si (KR); Tae Gon Kim, Hwaseong-si (KR); Taekhoon Kim, Hwaseong-si (KR); Shang Hyeun Park, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/194,794

(22) Filed: Apr. 3, 2023

(65) Prior Publication Data

US 2023/0255043 A1     Aug. 10, 2023

Related U.S. Application Data

(63) Continuation of application No. 17/080,069, filed on Oct. 26, 2020, now Pat. No. 11,621,403.

(30) Foreign Application Priority Data

Oct. 25, 2019    (KR) ........................ 10-2019-0134123

(51) Int. Cl.
    *H10K 50/115*      (2023.01)
    *C09K 11/02*        (2006.01)
    (Continued)

(52) U.S. Cl.
    CPC ............ *H10K 50/115* (2023.02); *C09K 11/02* (2013.01); *C09K 11/565* (2013.01); *C09K 11/703* (2013.01); *C09K 11/883* (2013.01)

(58) Field of Classification Search
CPC ..... H01L 51/502; C09K 11/02; C09K 11/565; C09K 11/703; C09K 11/883
See application file for complete search history.

(56) References Cited

U.S. PATENT DOCUMENTS

| | | |
|---|---|---|
| 7,476,487 B2 | 1/2009 | Park et al. |
| 7,746,423 B2 | 6/2010 | Im et al. |

(Continued)

FOREIGN PATENT DOCUMENTS

| | | |
|---|---|---|
| CN | 108893119 A | 11/2018 |
| EP | 3327813 A1 | 5/2018 |

(Continued)

OTHER PUBLICATIONS

Ippen et al.,"Color tuning of indium phosphide quantum dots for cadmium-free quantum dot light emitting devices with high efficiency and color saturation" JSID vol. 23, issue 7, pp. 285-293 (Year: 2015).*

(Continued)

*Primary Examiner* — Tracie Y Green
(74) *Attorney, Agent, or Firm* — CANTOR COLBURN LLP

(57) ABSTRACT

A cadmium-free, core shell quantum dot, a quantum dot polymer composite, and electronic devices including the quantum dot polymer composite. The core shell quantum dot has an extinction coefficient per gram of greater than or equal to 0.3, an ultraviolet-visible absorption spectrum curve that has a positive differential coefficient value at 450 nm, wherein the core shell quantum dot includes a semiconductor nanocrystal core including indium and phosphorus, and optionally zinc, and a semiconductor nanocrystal shell disposed on the semiconductor nanocrystal core, the shell including zinc, selenium, and sulfur, wherein the core shell quantum dot has a quantum efficiency of greater than or (Continued)

equal to about 80%, and is configured to emit green light upon excitation.

19 Claims, 7 Drawing Sheets

(51) Int. Cl.
*C09K 11/56* (2006.01)
*C09K 11/70* (2006.01)
*C09K 11/88* (2006.01)

(56) References Cited

U.S. PATENT DOCUMENTS

| | | | |
|---|---|---|---|
| 9,196,682 | B2 | 11/2015 | Jang et al. |
| 10,126,587 | B2 | 11/2018 | Chung |
| 10,246,634 | B2 | 4/2019 | Yang et al. |
| 10,520,765 | B2 | 12/2019 | Chung |
| 10,533,127 | B2 | 1/2020 | Park et al. |
| 10,689,511 | B2 | 6/2020 | Ahn et al. |
| 10,782,611 | B2 | 9/2020 | Yang et al. |
| 11,621,403 | B2 * | 4/2023 | Won ............... C09K 11/70 257/40 |
| 2014/0001405 | A1 | 1/2014 | Guo et al. |
| 2017/0023830 | A1 * | 1/2017 | Yang ............... G02F 1/134336 |
| 2017/0052444 | A1 | 2/2017 | Park et al. |
| 2017/0059986 | A1 | 3/2017 | Jun et al. |
| 2017/0137360 | A1 | 5/2017 | Curley et al. |
| 2017/0306227 | A1 | 10/2017 | Ippen et al. |
| 2018/0105739 | A1 | 4/2018 | Kim et al. |
| 2018/0119007 | A1 | 5/2018 | Ippen et al. |
| 2018/0142149 | A1 | 5/2018 | Youn et al. |
| 2019/0185743 | A1 | 6/2019 | Kim et al. |
| 2019/0211260 | A1 * | 7/2019 | Won ............... H05B 33/14 |
| 2019/0339565 | A1 * | 11/2019 | Jeon ............... G02F 1/133502 |
| 2020/0017765 | A1 | 1/2020 | Kim et al. |
| 2020/0172806 | A1 * | 6/2020 | Park ............... C09K 11/883 |

FOREIGN PATENT DOCUMENTS

| | | |
|---|---|---|
| EP | 3511394 A1 | 7/2019 |
| KR | 1020170022951 A | 3/2017 |
| KR | 1020170034055 A | 3/2017 |
| KR | 1020170048220 A | 5/2017 |
| KR | 1020180043748 A | 4/2018 |
| KR | 1020180058208 A | 5/2018 |
| KR | 1020180081002 A | 7/2018 |
| KR | 1020180096535 A | 8/2018 |
| KR | 20180135063 A | 12/2018 |
| KR | 1020190019863 A | 2/2019 |
| KR | 1020190073301 A | 6/2019 |
| KR | 20190085885 A | 7/2019 |
| KR | 1020190085885 A | 7/2019 |
| KR | 1020200006941 | 1/2020 |
| WO | 2018220168 A2 | 12/2018 |

OTHER PUBLICATIONS

Extended European Search Report dated Feb. 25, 2021, issued in corresponding European Patent Application No. 20203824.6.

Hung Chia Wang, Cadmium-Free InP/ZnSeS/ZnS Heterostructure-Based Quantum Dot Light-Emitting Diodes with a ZnMgO Electron Transport Layer and a Brightness of Over 10 000 cd m-2, Small 2017, 13, 1603962, 7 pages.

Jaehoon Lim, et al., Highly Efficient Cadmium-Free Quantum Dot Light-Emitting Diodes Enabled by the Direct Formation of Excitons within InP@ZnSeS Quantum Dots, vol. 7, Np. 10, 9019-9026, 2013.

* cited by examiner

CORE SHELL QUANTUM DOT AND ELECTRONIC DEVICE INCLUDING THE SAME

CROSS-REFERENCE TO RELATED APPLICATION

This is a continuation application of U.S. patent application Ser. No. 17/080,069 filed Oct. 26, 2020, which in turn claims priority to Korean Patent Application No. 10-2019-0134123 filed in the Korean Intellectual Property Office on Oct. 25, 2019, and all the benefits accruing therefrom under 35 U.S.C. §§ 119, 120, the contents of which in its entirety are incorporated herein by reference.

BACKGROUND

1. Field

A core shell quantum dot, a composition or a composite including the core shell quantum dot, and an electronic device including the core shell quantum dot or the composite are disclosed.

2. Description of the Related Art

Quantum dots (i.e., nano-sized semiconductor nanocrystals) may have different energy bandgaps depending upon the particle size and composition of the nanocrystals, and thus, may emit light of various photoluminescence wavelengths. Quantum dots may exhibit electroluminescence and photoluminescence properties. A chemical wet process using an organic material such as dispersing agents capable of coordinating a surface of the semiconductor nanocrystal during crystal growth may provide a quantum dot having a controlled or adjusted particle size and showing the photoluminescence properties. Luminescence properties of quantum dots may be used in many commercial applications, and in particular, as light emitting elements in electronic devices. The research and development of environmentally friendly quantum dots capable of realizing or exhibiting improved photoluminescence properties is desired and of interest.

SUMMARY

An embodiment provides a core shell quantum dot having improved photoluminescence properties and stability.

Another embodiment provides a method of making the core shell quantum dot.

Another embodiment provides a composition including the core shell quantum dot.

Another embodiment provides a quantum dot polymer composite including the core shell quantum dot (i.e., a plurality of core shell quantum dots).

Another embodiment provides a stacked structure and an electronic (display) device including the quantum dot polymer composite.

In an embodiment, a core shell quantum dot includes a semiconductor nanocrystal core including indium (In) and phosphorus (P), and optionally zinc (Zn), and a semiconductor nanocrystal shell disposed on the semiconductor nanocrystal core, the semiconductor nanocrystal shell including zinc, selenium, and sulfur, wherein the core shell quantum dot does not include cadmium, wherein the core shell quantum dot exhibits an extinction coefficient per gram that is greater than or equal to about 0.3, wherein the core shell quantum dot exhibits an ultraviolet-visible absorption spectrum curve that has a positive differential coefficient value (i.e., tangential slope) at 450 nm, and wherein the core shell quantum dot is configured to emit green light upon excitation.

In an embodiment, the core shell quantum dot has a quantum efficiency of greater than or equal to about 80%.

The extinction coefficient per gram may be greater than or equal to 0.31.

The extinction coefficient per gram may be greater than or equal to 0.32.

The extinction coefficient per gram may be greater than or equal to 0.35.

The extinction coefficient per gram may be less than or equal to about 2. The extinction coefficient per gram may be less than or equal to about 1, less than or equal to about 0.9, less than or equal to about 0.8, less than or equal to about 0.7, less than or equal to about 0.6, or less than or equal to about 0.5.

In an UV-Vis absorption spectrum of the core shell quantum dot, a valley depth (VD) defined by the following equation may be greater than or equal to about 0.4:

$$1-(Abs_{valley}/Abs_{first})=VD$$

wherein, $Abs_{first}$ is an absorption rate at the first absorption peak, and $Abs_{valley}$ is an absorption rate at the lowest point of the valley adjacent to the first absorption peak.

The core shell quantum dot may have a valley depth of greater than or equal to about 0.45, or greater than or equal to about 0.5.

In the core shell quantum dot, a mole ratio of sulfur to selenium may be less than or equal to about 3.5:1, less than or equal to about 3:1, less than or equal to about 2.5:1, less than or equal to about 2.4:1, or less than or equal to about 2.3:1.

In the core shell quantum dot, a mole ratio of sulfur relative to selenium may be greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.5:1, or greater than or equal to about 2:1.

In the core shell quantum dot, a mole ratio of zinc to indium may be greater than or equal to about 10:1, greater than or equal to about 11:1, greater than or equal to about 12:1, greater than or equal to about 13:1, greater than or equal to about 14:1, greater than or equal to about 15:1, greater than or equal to about 16:1, or greater than or equal to about 17:1.

In the core shell quantum dot, a mole ratio of zinc to indium may be less than or equal to about 24:1, less than or equal to about 23:1, less than or equal to about 22:1, less than or equal to about 21:1, less than or equal to about 20:1, less than or equal to about 19:1, less than or equal to about 18:1, less than or equal to about 17:1, less than or equal to about 16:1, or less than or equal to about 14:1.

In the core shell quantum dot, a mole ratio of phosphorus to indium may be greater than or equal to about 0.7:1, greater than or equal to about 0.75:1, greater than or equal to about 0.8:1, greater than or equal to about 0.85:1, or greater than or equal to about 0.9:1.

In the core shell quantum dot, a mole ratio of phosphorus relative to indium may be less than or equal to about 1.5:1, less than or equal to about 1.4:1, less than or equal to about 1.3:1, less than or equal to about 1.2:1, less than or equal to about 1.1:1, or less than or equal to about 1:1.

An average size of the semiconductor nanocrystal core may be greater than or equal to about 1.5 nanometers (nm).

A maximum peak emission wavelength of the green light may be greater than or equal to about 500 nm, or greater than or equal to about 505 nm.

A maximum peak emission wavelength of the green light may be less than or equal to about 530 nm, less than or equal to about 525 nm, less than or equal to about 520 nm, less than or equal to about 515 nm, or less than or equal to about 510 nm.

The quantum dot may have a quantum efficiency of greater than or equal to about 81%, greater than or equal to about 82%, greater than or equal to about 83% greater than or equal to about 84%, greater than or equal to about 85%, or greater than or equal to about 90%.

The shell may have a thickness of about 6 monolayers or less.

The shell may include a first semiconductor nanocrystal shell that is disposed on the semiconductor nanocrystal core, and the first shell including zinc, selenium, and sulfur, and a second semiconductor nanocrystal shell disposed on the first semiconductor nanocrystal shell, and the second shell including zinc and sulfur.

A thickness of the first semiconductor nanocrystal shell may be about 4 monolayers (ML) or less, or about 3.5 ML or less.

A thickness of the first semiconductor nanocrystal shell may be about 1 ML or more, about 1.5 ML or more, about 2 ML or more, about 2.5 ML or more, or about 3 ML or more.

A thickness of the second semiconductor nanocrystal shell may be less than or equal to about 1 nm, less than or equal to about 0.9 nm, less than or equal to about 0.8 nm, less than or equal to about 0.7 nm, or less than or equal to about 0.6 nm.

The first semiconductor nanocrystal shell may be disposed directly on the semiconductor nanocrystal core.

The second semiconductor nanocrystal shell may be disposed directly on the first semiconductor nanocrystal shell.

The second semiconductor nanocrystal shell may be an outermost layer of the quantum dot.

A composition according to another embodiment includes the aforementioned cadmium-free, core shell quantum dots; a dispersing agent; and a solvent (e.g., an organic solvent). The dispersing agent may include a carboxylic acid group-containing binder polymer. The composition may further include a photopolymerizable monomer including a carbon-carbon double bond, and optionally a (thermal- or photo-) initiator.

In another embodiment, the quantum dot polymer composite includes a polymer matrix and (e.g., a plurality of) the aforementioned cadmium-free, core shell quantum dot(s) dispersed in the polymer matrix.

The polymer matrix may include a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit derived from carbon-carbon unsaturated bonds (e.g., carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The polymer matrix may include a carboxylic acid group-containing compound (e.g., a binder, a binder polymer, or a dispersing agent) (for example, for dispersing a quantum dot or acting as a binder).

The carboxylic acid group-containing compound may include a monomer combination including a first monomer including a carboxylic acid group and a carbon-carbon double bond, a second monomer having a carbon-carbon double bond and a hydrophobic moiety, and a second monomer not including a carboxylic acid group, and optionally, a third monomer including a carbon-carbon double bond and a hydrophilic moiety and not including a carboxylic acid group, or a copolymer thereof;

a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

The polymer matrix may further include a polymerized product of a monomer combination including a (polyfunctional or monofunctional) thiol compound (e.g., mono- or multi-thiol compound) having at least one thiol group at the terminal end and an ene compound having a carbon-carbon unsaturated bond, a metal oxide particulate, or a combination thereof.

The quantum dot polymer composite may have a form of a patterned film.

The quantum dot polymer composite may have an absorption rate of greater than or equal to about 90% for blue light having a wavelength in the range of about 450 nm to about 470 nm, when the composite is in a form of a film having a thickness of 6 micrometers (μm) and a content of the core shell quantum dots in the composite is less than or equal to about 45 percent by weight (wt %) based on a total weight of the composite. In an embodiment, the quantum dot polymer composite may be prepared from a thermal treatment at about 180° C. for 30 minutes. The quantum dot polymer composite may have a blue light conversion rate of greater than or equal to about 30%, In another embodiment, a display device includes a light source and a photoluminescence element, and the photoluminescence element includes the aforementioned quantum dot polymer composite, and the light source is configured to provide the photoluminescence element with incident light.

The incident light may have a peak wavelength of about 440 nm to about 460 nm, or about 450 nm to about 455 nm.

The photoluminescence element may include a sheet of the quantum dot polymer composite.

The photoluminescence element may be a stacked structure including a substrate and a light emitting layer disposed on the substrate, wherein the light emitting layer includes a quantum dot polymer composite pattern.

The pattern may include at least one repeating section to emit light at a predetermined wavelength.

The pattern may include a first repeating section that emits first light.

The pattern may further include a second repeating section that emits second light having a different wavelength from the first light.

The core shell quantum dot according to an embodiment may exhibit improved photoluminescence properties (e.g., improved blue light absorption rate and luminous efficiency) . The composition including the cadmium-free, core shell quantum dot according to an embodiment may exhibit improved processability. The cadmium-free, core shell quantum dot of an embodiment may be used in various display devices and biological labeling (e.g., biosensors or bio-imaging), photodetectors, solar cells, hybrid composites, and the like. The improved blue light absorption rate of the cadmium-free, core shell quantum dot of an embodiment may have potential usefulness in a quantum dot-based photoluminescent color filter. The photoluminescent color filter may be utilized in various blue light sources, for example, blue light OLEDs, blue light emitting micro LEDs, liquid crystal display devices including blue light sources, and the like.

DETAILED DESCRIPTION

Figure 1:
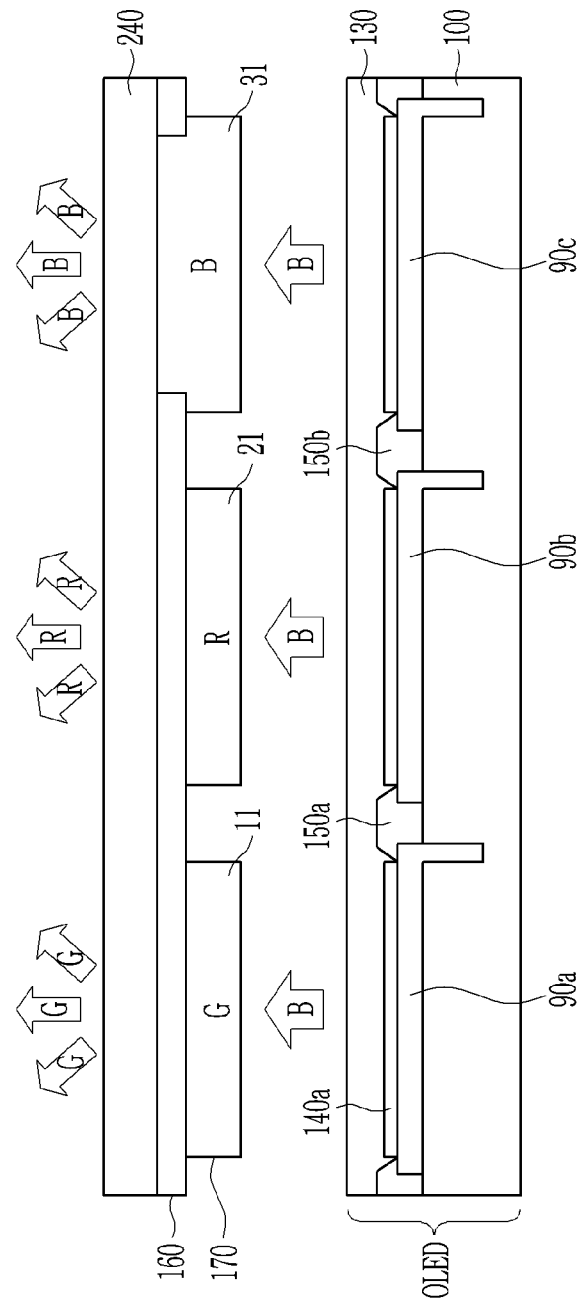
FIG. 1 is a schematic view showing a cross section of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms (including technical and scientific terms) in the specification may be defined as commonly understood by one skilled in the art to which this disclosure belongs. It will be further understood that terms, such as those defined in a generally-used dictionary should be interpreted as having a meaning that is consistent with their meaning in the context of the relevant art and the present disclosure, and will not be interpreted ideally or exaggeratedly unless expressly so defined.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within ±10% or ±5% of the stated value.

As used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino or amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (~PO$_3$MH or —PO$_3$M$_2$, wherein M is an organic or inorganic cation), and a combination thereof.

As used herein, when a definition is not otherwise provided, "hetero" refers to inclusion of at least one (for example, one to three) heteroatoms selected from N, O, S, Si, and P.

As used herein, "alkylene group" refers to a straight or branched saturated aliphatic hydrocarbon group having at least two valences and optionally substituted with at least one substituent.

As used herein, "arylene group" refers to a functional group having at least two valences obtained by removal of at least two hydrogens in at least one aromatic ring, and optionally substituted with at least one substituent.

In addition, "aliphatic hydrocarbon group" refers to a C1 to C30 linear or branched alkyl group, a C2 to C30 linear or branched alkenyl group, or a C2 to C30 linear or branched alkynyl group, "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, and a C3 to C30 cycloalkynyl group.

As used herein, "(meth)acrylate" refers to acrylate and/or methacrylate.

As used herein, the term light conversion rate or efficiency refers to a ratio of a light emission dose relative to absorbed light dose of a quantum dot polymer composite from excitation light (i.e., blue light). The total light dose (B) of excitation light is obtained by integrating a PL spectrum, the PL spectrum of the quantum dot polymer composite film is measured, a dose (A) of light in a green or red wavelength emitted from the quantum dot composite film and a dose (B') of excitation light are obtained, and a light conversion rate and a blue light absorption rate are obtained by the following equation:

$A/(B-B')\times 100\%$=light conversion rate (%)

$(B-B')/B\times 100\%$=blue light absorption rate (%) of single film

In an embodiment, "dispersion" refers to dispersion wherein a dispersed phase is a solid and a continuous phase includes a liquid or a solid different from the dispersed phase. In an embodiment, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, "extinction coefficient per gram" refers to a value obtained by dividing a product of multiplying an absorbance at 450 nm of a QD solution including given quantum dots with a volume of the QD solution by a dried weight of the given quantum dots included in the solution. A (absorbance)=εcl, where c is a molar concentration mol/L (M), ε is a molar extinction coefficient (M$^{-1}$ cm$^{-1}$), l is a path length, and thus when the c is a gram concentration (g/L), ε may represent an extinction coefficient per gram (L g$^{-1}$ cm$^{-1}$). Therefore, as the ε equals A/[c(g/L)*l], a value obtained by dividing [A*quantum dot solution volume (L)] by the quantum dot weight (g) when the path length (cm)=1 cm is the extinction coefficient per gram in the present disclosure.

As used herein, the term "Group" refers to a group of Periodic Table.

As used herein, "Group I" refers to Group IA and Group IB, and includes Li, Na, K, Rb, or Cs, but is not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" includes a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

The term "average" used in this specification (e.g., an average size of the quantum dot) may be mean or median. In an embodiment, the average may be "mean" average.

The quantum efficiency of the quantum dot may be a quantum yield that can be readily and reproducibly measured by any commercially available equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the PL wavelengths, but are not limited thereto.

The FWHM and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy harmful metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, "first absorption peak wavelength" refers to a wavelength of the first main peak appearing in the lowest energy region in an ultraviolet-visible absorption spectrum.

A quantum dot is a crystalline semiconductor material (e.g., semiconductor nanocrystal particle) having a nanoscale size. The quantum dot has a large surface area per a unit volume due to the very small particle size, and thus, exhibits a quantum confinement effect and different properties than those of a bulk material having the same elemental composition. The quantum dot may absorb light from an excitation source and then emit light energy corresponding to a bandgap energy of the quantum dot. The quantum dot has unique photoluminescence characteristics, and may show a relatively high luminous efficiency and excitation light absorption rate that are desirable for a use in a photoluminescent color filter.

Presently, a majority of quantum dots exhibiting optical properties applicable to electronic devices such as for displays are cadmium-based quantum dots. However, cadmium raises serious environment/health problems and concerns, and is one of restricted elements under Restriction of Hazardous Substances Directive (RoHS) in many countries. Accordingly, development of a cadmium-free quantum dot having improved photoluminescence characteristics is desired and of interest. Cadmium-free quantum dots are Group III-V-based nanocrystals. However, cadmium-free quantum dots based on Group III-V (e.g., InP) can exhibit poor stability (e.g., chemical stability and thermal stability) compared with cadmium-based quantum dots and may exhibit less desirable photoluminescence properties for application to electronic devices, e.g., an emission peak with a wider full width at half maximum (FWHM). A quantum dot having a relatively narrow (FWHM) may be desired for a quantum dot display device (e.g., including a color conversion layer including the quantum dot), and to realize a display device having a relatively high color reproducibility under a next generation color standard such as BT2020.

Accordingly, attempts to achieve photoluminescence properties and stability by passivating an InP-based core with a shell having increased thickness have been made. The shell may include a Group II-VI compound such as ZnS, ZnSe, and ZnSeS. While a band level difference between the core and shell materials may be large enough to suppress exciton diffusion, a crystal constant difference between the shell and the InP-based core may also be too large. Therefore, the probability to provide a uniform shell on the InP-based core can be quite low. Without wishing to be bound by any theory, the InP tends to form non-uniform core particles due to high covalent bonding properties, and thus, likely include many surface defects. The aforementioned features of the InP based core can make uniform passivation of the core with a shell difficult to achieve.

To show photoluminescence properties, e.g., for a display device, a quantum dot may use blue light as excitation light. Cadmium-based quantum dots may exhibit high absorption rate with blue light, but most of cadmium-free quantum dots (particularly, those emitting green light) do not exhibit high absorption rate with respect to blue light. Without wishing to be bound by any theory, according to the research of the present inventors, it is believed that in the case of a cadmium-based core shell (e.g., CdSe/CdS/ZnS) quantum dot, both the core and the shell may contribute to the absorption of blue light, but in the case of an InP core shell quantum dot, a ZnSe shell material, which is often used in such quantum dots, may only provide a small contribution to blue absorption, and thus a thin shell of a ZnSe may be advantageous in terms of an absorption rate. However, in the preparation of cadmium-free, core shell quantum dots, it can be quite difficult to make the shell thickness thin enough to provide high luminous efficiency and light stability. For this reason, in the case of an indium phosphide-based quantum dots, it is a challenging technical task to simultaneously provide high absorption rate and high luminous efficiency.

The present inventors have found that while an increased thickness of a shell may be required to achieve a desired level of stability and luminous properties of a cadmium-free, core shell quantum dot, an increase in the shell thickness tends to increase a weight of a single quantum dot, which in turn will lead to a decrease in the total number of quantum dots for a given weight of the quantum dots (e.g., in a quantum dot polymer composite), and thus, a resulting quantum dot polymer composite tends to show a decreased excitation light absorption rate.

To date, most (or almost all) of the indium phosphide based core shell quantum dots that emit green light with a desired luminous efficiency may exhibit an absorption curve of a decreasing absorbance with an increase of a wavelength, in particular, in a blue light region of greater than or equal to about 450 nm and less than or equal to about 470 nm. According to the research of the present inventors, the aforementioned shape of the UV-Vis absorption cure may lead to a relatively sharp decrease in an absorption rate of quantum dot composite, for example, when an OLED emitting light of a wavelength longer than 450 nm is used as a light source.

When being applied as a patterned film such as a color filter, e.g., in a display, a decrease in excitation light absorption can be a direct cause of blue light leakage in a display device, which may have an adverse effect on color reproducibility (e.g., DCI matching rate), and may cause a decrease in a luminous efficiency as the display device may have to use an absorption type color filter to prevent blue light leakage. In addition, the low absorption rate of the quantum dots may be translated into a reduced level of luminance in the device including the same.

The core shell quantum dot according to an embodiment has a following structure and/or composition, and thus may simultaneously have improved (photo)luminescence properties and light stability. The core shell quantum dot according to an embodiment may provide improved absorption rate for light sources that emit light having a wavelength of greater than or equal to about 450 nm and less than or equal to about 470 nm, even when provided in a form of a quantum dot composite.

The core shell quantum dot according to an embodiment (hereinafter, also is referred to as "quantum dot", and the expression of a singular form "quantum dot" may also refer to a plurality of quantum dots) does not include cadmium, and is configured to emit green light upon excitation. The quantum dot includes a semiconductor nanocrystal core including indium (In) and phosphorus (P), and a semiconductor nanocrystal shell disposed on the semiconductor nanocrystal core, the semiconductor nanocrystal shell including zinc, selenium, and sulfur.

In one embodiment, the semiconductor nanocrystal core may further include zinc. The semiconductor nanocrystal core may be InP, InZnP, or a combination thereof. The core of an embodiment is synthesized under a zinc concentration controlled by a method that will be described later, and thus, may have a reduced number of surface defects and a reduced level of oxidation, and on this core, it becomes possible to form a more uniform shell on the core, and therefore, a resulting quantum dot of the embodiment may exhibit simultaneously an improved luminous efficiency and increased absorption rate even with a relatively thin shell.

In addition, the size of the core may be appropriately selected in consideration of a desired photoluminescence wavelength. For example, the size of the core may be greater than or equal to about 1 nm, greater than or equal to about 1.5 nm, or greater than or equal to about 2 nm. For example, the size of the core may be less than or equal to about 5 nm, less than or equal to about 4 nm, or less than or equal to about 3 nm.

A thickness of the shell may be about 6 monolayers (ML) or less, about 5.5 ML or less, about 5 ML or less, or about 4.5 ML or less. The thickness of the shell may be about 2 ML or more, about 2.5 ML or more, about 3 ML or more, or about 3.5 ML or more. The thickness of the shell may be less than or equal to about 2.3 nm, for example, less than or equal to about 2.2 nm, less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.5 nm, or less than or equal to about 1.4 nm. The thickness of the shell may be greater than or equal to about 0.5 nm, greater than or equal to about 0.6 nm, greater than or equal to about 0.7 nm, greater than or equal to about 0.8 nm, greater than or equal to about 0.9 nm, or greater than or equal to about 1 nm.

The shell may have a multi-layer structure. The first semiconductor nanocrystal shell (or referred to as the first shell) may be disposed on the semiconductor nanocrystal core and may include zinc, selenium, and sulfur, and the second semiconductor nanocrystal shell (or referred to as the second shell) may be disposed on the first semiconductor nanocrystal shell and may include zinc and sulfur. The second semiconductor nanocrystal shell may further include selenium. A composition of the second semiconductor nanocrystal shell may be different from that of the first semiconductor nanocrystal shell.

In the first semiconductor nanocrystal shell, a mole ratio of sulfur based a total mole content (sum) of selenium and sulfur may be greater than or equal to about 0.1:1, greater than or equal to about 0.15:1, greater than or equal to about 0.2:1, greater than or equal to about 0.25:1, or greater than or equal to about 0.3:1. In the first semiconductor nanocrystal shell, the mole ratio of sulfur based upon a total mole content of selenium and sulfur may be less than or equal to about 0.7:1, less than or equal to about 0.6:1, or less than or equal to about 0.5:1. For example, in the first semiconductor nanocrystal shell, a mole ratio of sulfur based a total mole content of selenium and sulfur may be from about 0.1:1 to about 0.7:1, from about 0.15:1 to about 0.6:1, or from about 0.2:1 and to about 0.5:1.

With the first shell has the aforementioned composition range, the quantum dots of an embodiment may exhibit improved luminous efficiency along with a high absorption rate.

A thickness of the first semiconductor nanocrystal shell may be about 4 monolayers (ML) or less, about 3.5 ML or less, or about 3 ML or less. The thickness of the first semiconductor nanocrystal shell may be about 1 ML or more, about 1.5 ML or more, about 2 ML or more, or about 2.5 ML or more.

A thickness of the second semiconductor nanocrystal shell may be less than or equal to about 1 nm, less than or equal to about 0.9 nm, less than or equal to about 0.8 nm, less than or equal to about 0.7 nm, or less than or equal to about 0.6 nm. The thickness of the second semiconductor nanocrystal shell may be about 1 ML or more, or about 1.5 ML or more.

The first semiconductor nanocrystal shell may be disposed directly on the semiconductor nanocrystal core. The second semiconductor nanocrystal shell may be disposed directly on the first semiconductor nanocrystal shell. The second semiconductor nanocrystal shell may be an outermost layer of the quantum dots.

In the quantum dots according to an embodiment, a mole ratio of sulfur to selenium may be less than or equal to about 3.5:1. In the quantum dots according to an embodiment, a mole ratio of sulfur to selenium may be less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1. In the quantum dots according to an embodiment, the mole ratio of sulfur to selenium may be greater than or equal to about 0.05:1, greater than or equal to about 0.07:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9:1.

In the core shell quantum dots according to an embodiment, a mole ratio of zinc to indium may be less than or equal to about 24:1, less than or equal to about 23:1, less than or equal to about 22:1, less than or equal to about 21:1, less than or equal to about 20:1, less than or equal to about 19:1, less than or equal to about 18:1, less than or equal to about 17:1, less than or equal to about 16:1, less than or equal to about 15:1, or less than or equal to about 14:1. In the core shell quantum dots according to an embodiment, the mole ratio of zinc to indium may be greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, greater than or equal to about 11:1, greater than or equal to about 12:1, greater than or equal to about 13:1, greater than or equal to about 14:1, or greater than or equal to about 15:1.

In the core shell quantum dots, a mole ratio of phosphorus to indium may be greater than or equal to about 0.7:1, greater than or equal to about 0.75:1, greater than or equal to about 0.8:1, greater than or equal to about 0.85:1, or greater than or equal to about 0.9:1. In the core shell quantum dot, the mole ratio of phosphorus to indium may be less than or equal to about 1.5:1, less than or equal to about 1.4:1, less than or equal to about 1.3:1, less than or equal to about 1.2:1, less than or equal to about 1.1:1, or less than or equal to about 1:1. For example, in the core shell quantum dot, a mole ratio of phosphorous to indium may be from about 0.7:1 to about 1:1, from about 0.8:1 to about 1.2:1, or from about 0.85:1 to about 1.3:1, or from about 0.9 to about 1.

In the core shell quantum dots, a mole ratio of indium to a total moles of chalcogen element (e.g., a total sum of S and Se) may be greater than or equal to about 0.05:1, greater than or equal to about 0.06:1, or greater than or equal to about 0.07:1 and less than or equal to about 0.15:1, less than or equal to about 0.14:1, less than or equal to about 0.13:1, less than or equal to about 0.12:1, less than or equal to about 0.11:1, less than or equal to about 0.105:1, less than or equal to about 0.1:1, less than or equal to about 0.095, less than or equal to about 0.09:1, less than or equal to about 0.085:1, less than or equal to about 0.08:1, or less than or equal to about 0.075:1.

The core shell quantum dot(s) of an embodiment having the aforementioned structure and composition may emit green light with an increased blue light absorption rate and improved luminous efficiency. The quantum dots having the aforementioned shell composition according to an embodiment may provide a quantum dot polymer composite with an improved excitation light absorption rate and improved luminous efficiency.

In case of an indium phosphide-based quantum dots, a shell of an increased thickness may be desired for an improved level of luminous efficiency and stability (e.g., for the external environment). However, according to the research of the present inventors, the shell thickness, in combination with its composition, may affect an absorption rate of quantum dots. The present inventors have also found that in case of a shell having a predetermined volume, there may be a volume contributing to the absorption rate depending on the shell composition. In a core shell quantum dot of an embodiment, the aforementioned composition and the structure may accomplish increased luminous efficiency while maintaining the improved absorption rate at a relatively limited thickness.

The present inventors have found that with a decrease in the thickness of the ZnSeS shell together with having a relatively higher S mole ratio (e.g., in the ZnSeS shell), the overlap between the electrons and the holes may increase, and this is believed to contribute to an increase in the absorption rate.

The present inventors have also found that as the S mole ratio of ZnSeS is increased for a predetermined thickness, a probability of electrons present inner side of the quantum dot may also increase, which may be advantageous for surface passivation and may result in an increase of luminous efficiency.

In addition, the present inventors have found that the increase of the sulfur mole ratio in the shell adjacent to (e.g., directly on) the core may have a substantial influence on lattice strain between the shell and the core, and thus, result in a bandgap decrease, a shell structure change, or a decrease in efficiency. Accordingly, the quantum dot(s) having the aforementioned composition and structure according to an embodiment may exhibit an improved blue light absorption rate as well as desired luminous efficiency and stability.

In a multi-layered core-shell quantum dot(s) of an embodiment, the (e.g., ZnSeS-based) first semiconductor nanocrystal shell within the aforementioned range may have a positive influence on increasing quantum dot luminous efficiency, and the (e.g., ZnS-based) second semiconductor nanocrystal shell within the aforementioned range may contribute achieving and/or maintaining an improved excitation light (e.g., blue light) absorption rate substantially without an adverse influence or effect on luminous efficiency for example, when the quantum dots are formed into a composite film of a quantum dot-polymer composite.

In addition, the quantum dot(s) of an embodiment having the aforementioned composition and structure may exhibit an enhanced chemical stability. Accordingly, for example, even when the quantum dots of the embodiment go through a process of preparing a composition (e.g., a photosensitive composition or a photoresist) accompanying contacts with various chemical materials (e.g., an organic polymer, an organic solvent, a monomer, and various additives), or a process of forming a composite (or a pattern thereof), a resulting composition or composite (or a pattern thereof) including the same may exhibit and maintain improved photoluminescence properties.

A maximum peak emission wavelength of the green light may be greater than or equal to about 500 nm, greater than or equal to about 501 nm, greater than or equal to about 504 nm, or greater than or equal to about 505 nm. The maximum peak emission wavelength of the green light may be less than or equal to about 530 nm, less than or equal to about 525 nm, less than or equal to about 520 nm, less than or equal to about 515 nm, or less than or equal to about 510 nm.

In case of the quantum dot of an embodiment, the shell coating may have relatively enhanced uniformity due to the aforementioned structure and optimized composition, and thus the quantum dot of an embodiment may exhibit improved efficiency and stability even with a relatively thin shell thickness. In addition, since the quantum dot(s) of an embodiment has a relatively thin shell thickness together with the extinction coefficient in the aforementioned range, a larger number of quantum dots may be included in a defined volume in the form of a quantum dot-polymer composite, achieving a high level of excitation light absorption rate together with improved efficiency.

The quantum dot of an embodiment may have an extinction coefficient per gram of greater than or equal to about 0.3. The extinction coefficient per gram may be greater than or equal to about 0.31, greater than or equal to about 0.32, greater than or equal to about 0.33, greater than or equal to about 0.34, greater than or equal to about 0.35, greater than or equal to about 0.36, greater than or equal to about 0.37, or greater than or equal to about 0.38. The extinction coefficient per gram may be less than or equal to about 2. The extinction coefficient per gram may be less than or equal to about 1.5, less than or equal to about 1, less than or equal to about 0.9, less than or equal to about 0.8, less than or equal to about 0.7, less than or equal to about 0.6, less than or equal to about 0.5, or less than or equal to about 0.45. In an embodiment, the quantum dot of an embodiment may have an extinction coefficient per gram of from about 0.3 to about 2, from about 0.33 to about 0.9, or from about 0.34 to about 0.8.

The UV-Vis absorption spectrum curve of the core shell quantum dot has a positive differential coefficient value (i.e., tangential slope) at 450 nm. In the UV-Vis absorption spectrum curve, the differential coefficient value at 450 nm may be greater than about 0, for example, greater than or equal to about 0.001, greater than or equal to about 0.002, greater than or equal to about 0.003, greater than or equal to about 0.004, greater than or equal to about 0.005, or greater than or equal to about 0.006. The differential coefficient value may be less than or equal to about 0.03, less than or equal to about 0.025, less than or equal to about 0.02, less than or equal to about 0.015, less than or equal to about 0.01, less than or equal to about 0.0095, less than or equal to about 0.009, or less than or equal to about 0.0085. The quantum dot(s) of an embodiment may exhibit increased efficiency together with increased absorption rate for excitation light of greater than or equal to about 450 nm and less than or equal to about 470 nm. The differential coefficient value (i.e., a derivative of df(x)/dx, tangential slope) at 450 nm of the UV-Vis absorption curve may be easily measured by a simple analysis of the curve.

In the UV-Vis absorption spectrum curve of the quantum dot, the first absorption peak wavelength may be present at a wavelength of greater than about 450 nm and less than the photoluminescence emission peak wavelength. The first absorption peak wavelength may be present in a wavelength range of, for example, greater than or equal to about 455 nm, greater than or equal to about 460 nm, greater than or equal to about 465 nm, greater than or equal to about 470 nm, greater than or equal to about 475 nm, or greater than or equal to about 480 nm. The first absorption peak wavelength may be present in a wavelength range of less than or equal to about 505 nm, less than or equal to about 500 nm, less than or equal to about 495 nm, or less than or equal to about 490 nm.

When the quantum dot(s) of an embodiment are provided in a form of a quantum dot polymer composite, the quantum dot(s) having the aforementioned properties (e.g. extinction coefficient per gram and UV-Vis absorption spectrum curve described above) may exhibit a high absorption rate of greater than or equal to about 90% with respect to excitation light having a wavelength in the range of a wavelength of, for example, greater than or equal to about 450 nm and less than or equal to about 470 nm (e.g., greater than or equal to about 450 nm, greater than or equal to about 455 nm, or greater than or equal to about 460 nm and less than or equal to about 470 nm, or less than or equal to about 465 nm). A quantum dot polymer composite that exhibits such a level of absorption rate, or a color filter including the quantum dot polymer composite may enable improved color reproducibility in a display device, for example, without the need for a blue light filter.

The core shell quantum dot(s) of an embodiment may have a valley depth (VD) defined by the following equation of greater than or equal to about 0.4:

$$1-(Abs_{valley}/Abs_{first})=VD$$

wherein, $Abs_{first}$ is an absorption rate at the first absorption peak, and $Abs_{valley}$ is an absorption rate at the lowest point of the valley adjacent to the first absorption peak. The core shell quantum dots may have a valley depth of greater than or equal to about 0.45, or greater than or equal to about 0.5.

The quantum dot(s) of an embodiment may have a quantum efficiency of greater than or equal to about 80%, greater than or equal to about 81%, greater than or equal to about 82%, greater than or equal to about 83%, greater than or equal to about 84%, or greater than or equal to about 85%. The quantum dot may have a full width at half maximum (FWHM) of less than or equal to about 55 nm, for example, less than or equal to about 50 nm, less than or equal to about 45 nm, less than or equal to about 44 nm, less than or equal to about 43 nm, less than or equal to about 42 nm, less than or equal to about 41 nm, or less than or equal to about 40 nm. The quantum dot may have a full width at half maximum (FWHM) of greater than or equal to about 5 nm, for example, greater than or equal to about 10 nm, greater than or equal to about 15 nm, or greater than or equal to about 18 nm.

The quantum dot(s) may have a size (or an average size) of greater than or equal to about 1 nm, greater than or equal to about 2 nm, greater than or equal to about 3 nm, greater than or equal to about 4 nm, or greater than or equal to about 5 nm. The quantum dots may have a size of less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm.

The size of the quantum dots may be a particle diameter. The size of the quantum dots (if not spherical) may have an equivalent diameter calculated by converting a two-dimensional area identified by transmission electron microscopy into a circle. As used herein, a dimension such as a size (e.g., a quantum dot-related dimension) may refer to an average (mean or median average) value thereof (e.g., an average size). A shape of the quantum dots is not particularly limited, and may for example be a spherical, polyhedron, pyramid, multi-pod, or cube shape, nanotube, nanowire, nanofiber, nanosheet, or a combination thereof, but is not limited thereto.

The quantum dot(s) may include and organic ligand and/or the organic solvent which will be described later, on its surface. The organic ligand and/or the organic solvent may be bound to the surfaces of the quantum dots.

A method of producing the aforementioned quantum dot(s) according to embodiment includes preparing semiconductor nanocrystal core including indium (In) and phosphorus (P), and optionally zinc; and reacting a zinc shell precursor and at least one of a selenium precursor and a sulfur precursor in the presence of the core and a first organic ligand (e.g., in an organic solvent) simultaneously (collectively) or sequentially to form a semiconductor nanocrystal shell including zinc, selenium, and sulfur on the semiconductor nanocrystal core.

The preparing of the semiconductor nanocrystal core may include heating an indium compound in the presence of a second organic ligand and an organic solvent to prepare an indium precursor solution; and injecting a phosphorus precursor into the indium precursor solution and heating the obtained mixture. The method may further include obtaining a zinc precursor prior to preparing an indium precursor solution, and preparing the indium precursor solution in the presence of the zinc precursor. Depending on the types, the zinc precursor may be obtained by heating a zinc compound and an organic ligand at a high temperature (for example, a temperature of greater than or equal to about 100° C. and less than or equal to about 200° C.) in an organic solvent. During the core synthesis, a mole ratio of zinc to indium may be greater than or equal to about 1:1, greater than or equal to about 1.1:1, or greater than or equal to about 1.2:1, and less than or equal to about 3:1, less than or equal to about 2.5:1, or less than or equal to about 2:1.

In an embodiment, the zinc precursor and the indium precursor may include a carboxylate moiety. A mole ratio of the carboxylic acid-containing organic ligand relative to 1 mole of the metal in the zinc precursor (or the indium precursor) may be greater than or equal to about 1 mole, greater than or equal to about 1.5 moles, or greater than or equal to about 2 moles, and less than or equal to about 5 moles, less than or equal to about 4 moles, or less than or equal to about 3 moles.

The forming of the shell may include heating a mixture including a zinc shell precursor, a first organic ligand, and an organic solvent; injecting the semiconductor nanocrystal core into the heated mixture, and injecting a selenium precursor and a sulfur precursor to form a shell having a desired composition (for example, independently once or more or twice or more) to perform a reaction. The injection method of each precursor is not particularly limited, and may be performed simultaneously (collectively) or sequentially.

The forming of the shell may include forming a first semiconductor nanocrystal shell including zinc, sulfur, and selenium on the semiconductor nanocrystal core (hereinafter, a first shell forming process) and forming a second semiconductor nanocrystal shell including zinc and sulfur, and selenium as needed, on the first semiconductor nanocrystal shell (hereinafter, a second shell forming process).

During the formation of the shell, an amount of each of the precursors (e.g., the zinc precursor, the selenium precursor, and/or the sulfur precursor) may be controlled considering a structure and a composition of a final core shell quantum dot.

The types of zinc precursor or zinc shell precursor (hereinafter referred to as zinc precursor) are not particularly limited and may be appropriately selected. For example, the zinc precursor may be a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc precursors may be used alone or in combination of two or more.

The (first and/or second) organic ligand may include RCOOH, RNH$_2$, R$_2$NH, RN, RSH, RH$_2$PO, R$_2$HPO, R$_3$PO, RH$_2$P, R$_2$HP, R$_3$P, ROH, RCOOR', RPO(OH)$_2$, RHPOOH, R$_2$POOH (wherein, R and R' are independently a C1 to C40 (or C3 to C24) aliphatic hydrocarbon group (e.g., alkyl group, alkenyl group alkynyl group), or C6 to C40 (or C6 to C24) aromatic hydrocarbon group (e.g., C6 to C20 aryl group)), or a combination thereof. The organic ligand may coordinate the surface of the obtained nanocrystal and may improve upon the dispersion of nanocrystal in the solution and/or effect the light emitting and electrical characteristics of the quantum dots. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), and the like; phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, substituted or unsubstituted octylphosphine oxide (e.g., trioctylphosphine oxide (TOPO), and the like; diphenyl phosphine, triphenyl phosphine compound, or an oxide compound thereof; phosphonic acid, C5 to C20 alkylphosphinic acid such as hexylphosphinic acid, octylphosphinic acid, dodecanephosphinic acid, tetradecanephosphinic acid, hexadecanephosphinic acid, or octadecanephosphinic acid, or C5 to C20 alkyl phosphonic acid but is not limited thereto. The organic ligand may be used alone or as a mixture of two or more.

The organic solvent may be selected from C6 to C22 primary amine such as hexadecylamine; C6 to C22 secondary amine such as dioctylamine; C6 to C40 tertiary amine such as trioctylamine; a nitrogen-containing heterocyclic compound such as pyridine; C6 to C40 aliphatic hydrocarbon (e.g., alkane, alkene, alkyne, etc.) such as hexadecane, octadecane, octadecene, or squalane; C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; C12 to C22 aromatic ether such as phenyl ether, or benzyl ether, and a combination thereof. Types and amounts of the solvent may be appropriately selected considering precursors and organic ligands.

The type of the indium compound is not particularly limited and may be appropriately selected. The indium precursor may include an indium powder, alkylated indium compound, indium alkoxide, indium carboxylate, indium nitrate, indium perchlorate, indium sulfate, indium acetylacetonate, indium halide, indium cyanide, indium hydroxide, indium oxide, indium peroxide, indium carbonate, or a combination thereof. The indium precursor may include indium carboxylate such as indium oleate and indium myristate, indium acetate, indium hydroxide, indium chloride, indium bromide, and indium iodide. The forming of the indium precursor may be performed under vacuum at a temperature of greater than or equal to about 100° C., greater than or equal to about 120° C. and less than or equal to about 200° C.

The type of the phosphorus precursor is not particularly limited and may be appropriately selected. The phosphorus precursor may include tris(trimethylsilyl) phosphine, tris(dimethylamino)phosphine, triethylphosphine, tributylphosphine, trioctylphosphine, triphenylphosphine, tricyclohexylphosphine, dimethylaminophosphine, diethylaminophosphine, or a combination thereof.

The mixture obtained by injecting the phosphorus precursor during the core formation process may be heated to a temperature of greater than or equal to about 150° C., greater than or equal to about 200° C., greater than or equal to about 250° C., or greater than or equal to about 270° C. and less than or equal to about 300° C., less than or equal to about 290° C., less than or equal to about 280° C., less than or equal to about 270° C., or less than or equal to about 260° C. In the core formation process one or more of the precursors (e.g., an indium precursor, a phosphorus precursor, and/or a zinc precursor) may be additionally injected once or more as needed.

The core formation reaction time is not particularly limited, and may be appropriately selected in consideration of reactivity between precursors and core formation temperature.

The type of the selenium precursor is not particularly limited and may be appropriately selected. For example, the selenium precursor may be selenium-trioctylphosphine (Se-TOP), selenium-tributylphosphine (Se-TBP), selenium-triphenylphosphine (Se-TPP), selenium-diphenylphosphine (Se-DPP), or a combination thereof. The selenium precursor may be injected once or more (e.g., two or more times).

The type of the sulfur precursor is not particularly limited and may be appropriately selected. The sulfur precursor injected for shell formation (first shell formation and second shell formation, etc.) may include two or more different compounds. In an embodiment, for forming a shell, a thiol compound and elemental sulfur may be used. In an embodiment, the sulfur precursor for forming the first shell may include a thiol compound (e.g., a thiol compound having a C4 to C20 aliphatic hydrocarbon group such as alkanethiol, e.g., dodecanethiol, and the sulfur precursor for forming the second shell may be an organic solvent dispersion of sulfur powders (e.g., sulfur-octadecene (S-ODE), sulfur-trioctylphosphine (S-TOP), sulfur-tributylphosphine (S-TBP), sulfur-triphenylphosphine (S-TPP), sulfur-trioctylamine (S-TOA), or trimethylsilyl sulfur), mercapto propyl silane, trimethylsilyl sulfide, ammonium sulfide, sodium sulfide, or a combination thereof. The sulfur precursor may be injected one or more times (e.g., two or more times) as needed.

A shell forming temperature may be appropriately selected. In an embodiment, the shell forming temperature may be greater than or equal to about 270° C., greater than or equal to about 280° C., greater than or equal to about 290° C., greater than or equal to about 300° C., greater than or equal to about 310° C., or greater than or equal to about 315° C. In an embodiment, the shell forming temperature may be less than or equal to about 350° C., less than or equal to about 340° C., less than or equal to about 330° C., or less than or equal to about 325° C.

A shell forming reaction time is not particularly limited and may be appropriately selected. For example, the shell forming reaction may be performed, for example, for greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, or greater than or equal to about 1 hour, but is not limited thereto. The shell forming reaction time may be less than or equal to about 3 hours.

As noted above, each precursor/compound may be added in a single step or a plurality of steps. When adding each precursor or the like in stepwise, the reaction may be performed for a predetermined time (e.g., greater than or equal to about 5 minutes, greater than or equal to about 10 minutes, or greater than or equal to about 15 minutes) in each step. The reaction may be performed under an inert gas atmosphere, air, or under vacuum, but is not limited thereto.

In the first shell formation, the selenium precursor may be added once or more (e.g., two or more times or three or more times, etc.). Depending on the composition of the shell, the second shell formation may proceed in the presence or absence of a selenium precursor.

When the shell forming process includes forming the first shell and forming the second shell, each reaction time may be appropriately selected depending on the desired shell composition, the type of precursor, and the reaction temperature. The shell formation (or first shell formation and second shell formation) may be (e.g., independently) performed for greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes. A reaction time for shell formation (or first shell formation and/or second shell formation) may be (e.g., independently) less than or equal to about 4 hours, less than or equal to about 3 hours, less than or equal to about 2 hours, less than or equal to about 1 hour, or less than or equal to about 30 minutes.

When forming a multi-layered shell, an amount of the selenium precursor relative to indium in a reaction system (e.g., for forming the first shell) may be adjusted to form a first semiconductor nanocrystal shell having a predetermined thickness for a predetermined reaction time. The amount of the selenium precursor relative to indium in the reaction system (e.g., for forming the first shell), that is, an amount of selenium in moles per 1 mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles and less than or equal to about 20 moles, less than or equal to about 18 moles, or less than or equal to about 15 moles.

An amount of the thiol precursor per 1 mole of indium in the reaction system at the time of shell formation (e.g., initial shell formation reaction or first shell formation) may be greater than or equal to about 0.5 moles, greater than or equal to about 1 mole, greater than or equal to about 1.5 moles, or greater than or equal to about 2 moles and less than or equal to about 15 moles, less than or equal to about 10 moles, less than or equal to about 9 moles, less than or equal to about 6 moles, less than or equal to about 4 moles, or less than or equal to about 3 moles.

The reaction system for forming the second shell may not include a selenium precursor.

In an embodiment, an amount of the sulfur precursor (e.g., an organic solvent dispersion of elemental sulfur) relative to 1 mole of indium in the shell forming (e.g., second shell) reaction system may be such that the desired shell composition may be obtained (in consideration of reactivity and reaction temperature of the precursors). For example, the amount of the sulfur precursor relative to 1 mole of indium in the shell forming (e.g., second shell) reaction system may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles and less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

A nonsolvent may be added into the obtained final reaction solution to precipitation of the quantum dots, the organic ligand-coordinated nanocrystals may then be separated (e.g. by filtration or centrifugation). The nonsolvent may be a polar solvent that is miscible with the solvent used in the reaction and the nanocrystals may be precipitated out (e.g., not-dispersible) therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to a washing solvent and washed, if necessary. The washing solvent has no particular limit and may have a similar solubility parameter to that of the organic ligand and may, for example, include hexane, heptane, octane, chloroform, toluene, benzene, and the like.

The quantum dots may be dispersed in a dispersion solvent. The quantum dots may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof.

The composition of an embodiment may include (e.g., a plurality of) the aforementioned quantum dot(s); a dispersing agent; and an (organic) solvent (and/or liquid vehicle). The dispersing agent may disperse the quantum dots, and may include a carboxylic acid group-containing binder polymer. The composition may further include a (photo) polymerizable monomer including a carbon-carbon double bond, and optionally (thermal or photo) initiator. The composition may have photosensitivity.

Details of the quantum dots in the composition are as described above. An amount of quantum dots in the composition may be appropriately adjusted in view of the desired end use (e.g., a color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of composition. The amount of the quantum dots may be less than or equal to about 70 wt %, for example, less than or equal to about 65 wt %, less than or equal to about 60 wt %, less than or equal to about 55 wt %, or less than or equal to about 50 wt %, based on a solid content of the composition. The weight percentage of the components relative to the total solids content in the composition may represent the contents of the components in the composite, which will be described later.

The composition according to an embodiment may be used to provide a quantum dot-polymer composite pattern. The composition according to an embodiment may be a photoresist composition including quantum dots applicable to a photolithography method. The composition according to an embodiment may be an ink composition that may provide a pattern by printing (e.g., a droplet discharge method such as inkjet printing). The composition according to an embodiment may not include a conjugated (or conductive) polymer (except a cardo binder that will be described later). The composition according to an embodiment may include a conjugated polymer. Herein, the conjugated polymer refers to a polymer having a conjugation double bond in its main chain (e.g., polyphenylenevinylene, etc.).

In the composition according to an embodiment, the dispersing agent may ensure dispersion of the quantum dots.

In an embodiment, the dispersing agent may be a binder (or binder polymer). The binder polymer may include a carboxylic acid group (e.g., in the repeating unit). The binder may be an insulating polymer. The binder may be a carboxylic acid group-containing compound (monomer or polymer).

The binder may include a carboxylic acid group-containing compound.

The carboxylic acid group-containing compound may include a monomer combination including a first monomer including a carboxylic acid group and a carbon-carbon double bond, a second monomer having a carbon-carbon double bond and/or a hydrophobic moiety, and a second monomer not including a carboxylic acid group, and optionally a third monomer including a carbon-carbon double bond and a hydrophilic moiety and not including a carboxylic acid group, or a copolymer thereof;

a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, cardo binder); or a combination thereof.

The carboxylic acid group-containing compound may have an acid value of greater than or equal to about 50 mg KOH/g. In an embodiment, the acid value of the carboxylic acid group-containing compound may be greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing compound may be, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The carboxylic acid group-containing compound may have a molecular weight (or weight average molecular weight) of greater than or equal to about 400 g/mol, greater than or equal to about 500 grams per mole (g/mol), greater than or equal to about 1000 g/mol, greater than or equal to about 2000 g/mol, greater than or equal to about 3000 g/mol, or greater than or equal to about 5000 g/mol. The carboxylic acid group-containing compound may have a weight average molecular weight of less than or equal to about 100,000 g/mol, for example, less than or equal to about 50,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight of the composition, but is not limited thereto. The amount of the binder polymer may be less than or equal to about 35 wt %, for example less than or equal to about 33 wt %, or less than or equal to about 30 wt % based on a total weight of the composition. The amount of the binder polymer may be about 0.5 wt % to about 55 wt % based on a total weight of a solid content of the composition.

In the composition, the polymerizable (e.g., photopolymerizable) monomer (hereinafter, may be referred to as "monomer") including the carbon-carbon double bond may include (e.g., photopolymerizable) (meth)acryl-based monomer. The monomer may be a precursor for an insulating polymer.

An amount of the monomer may be greater than or equal to about 0.5 wt %, for example, greater than or equal to about 1 wt %, or greater than or equal to about 2 wt % based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total weight of the composition.

The (photo)initiator included in the composition is a compound that imitates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the polymer matrix that will be described later) may further include a (multiple or monofunctional) thiol compound having at least one thiol group at the terminal end, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt % based on a total weight (or a solid content thereof) of the composition.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1000 nm or less than or equal to about 800 nm.

The multiple thiol compound may be a dithiol compound, a trithiol compound, a tetrathiol compound, or a combination thereof. For example, the thiol compound may be glycoldi-3-mercaptopropionate, glycoldimercaptoacetate, trimethylolpropane-tris(3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight (or a total weight of the solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt % based on a total weight (or a total weight of the solid content) of the composition.

The composition may further include an organic solvent (or a liquid vehicle, hereinafter referred to as a solvent). Types of the usable organic solvent are not particularly limited. A type and a content of the organic solvent may be appropriately determined by considering the aforementioned main components (i.e., the quantum dot, the dispersing agent, the polymerizable monomer, the initiator, and if used, the thiol compound,) and a type and an amount of an additive which is described later. The composition may include a solvent in a residual amount except for a desired content of the (non-volatile) solid.

If desired, the composition may further include various additives such as a light diffusing agent, a leveling agent, or a coupling agent in addition to the aforementioned components.

The components (binder, monomer, solvent, additive, thiol compound, cardo binder, etc.) included in the composition of an embodiment may be appropriately selected, for details described in, for example, US-2017-0052444-A1 may be referred.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., acryl-based monomer), optionally, the thiol compound, optionally, the metal oxide particulates, and optionally, the aforementioned additive. Each of the aforementioned components may be mixed sequentially or simultaneously, but mixing orders are not particularly limited.

The composition may provide a quantum dot-polymer composite by a (e.g., radical) polymerization.

Accordingly, in another embodiment, the quantum dot-polymer composite includes a polymer matrix; and the aforementioned core shell quantum dots dispersed in the polymer matrix. The quantum dot polymer composite may include the components described above in connection with the composition.

Because the core-shell quantum dot(s) according to an embodiment has an extinction coefficient per gram within the aforementioned range, and an ultraviolet-visible (UV-Vis) absorption spectrum that exhibits a positive differential coefficient at 450 nm, and can maintain improved luminous efficiency even if provided in the form of a quantum dot polymer composite, the quantum dot(s) may exhibit the improved absorption rate and high luminous efficiency for blue light as noted above (e.g., having a wavelength of a relatively wide range). Accordingly, in an embodiment, the quantum dot-polymer composite has a film shape having, for example, a thickness of about 6 micrometers (μm) or more, and if the quantum dots are included in a content of less than or equal to about 45 wt % based on a total weight of the composite, an absorption rate with respect to blue light of a wavelength of about 450 nm to about 470 nm may be greater than or equal to about 89%, for example, greater than or equal to about 90%, greater than or equal to about 91%, greater than or equal to about 92%, or greater than or equal to about 93%.

The polymer matrix may include at least one of a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), a polymerization product of the polymerizable monomer and a multiple thiol compound having at least two thiol groups at the terminal end, and/or a metal oxide particulate(s).

In another embodiment, the polymer matrix may include a linear polymer, a crosslinked polymer, or a combination thereof. The polymer matrix may not include a conjugated polymer (excepting cardo resin). The polymer matrix may include a conjugated polymer.

The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. In an embodiment, the crosslinked polymer may be a polymerization product of the polymerizable monomer and, optionally, the multiple thiol compound.

The linear polymer may include a repeating unit derived from carbon-carbon unsaturated bonds (e.g., carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The polymer matrix may include a carboxylic acid group-containing compound (e.g., a binder, a binder polymer, or a dispersing agent) (e.g., for dispersion of the quantum dots or the binder).

Details of the quantum dots, carboxylic acid group-containing compound (dispersing agent, or binder polymer), polymerizable monomer, and multiple thiol compound are the same as described above.

The film of the quantum dot polymer composite or the quantum dot polymer composite pattern that will be described later may have for example a thickness of, less than or equal to about 30 μm, for example less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm.

In another embodiment, patterned film includes a repeating section including a first section configured to emit first light, wherein the first section includes the aforementioned quantum dot polymer composite.

The repeating section may include a second section emitting second light having different wavelength from the first light, wherein the second section may include a quantum dot polymer composite. The quantum dot polymer composite of the second section may include a second quantum dot configured to emit the second light. The second quantum dot may include the aforementioned quantum dots. The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section emitting a third light (e.g., blue light) different from the first light and the second light. The third light may have a maximum peak wavelength ranging from about 380 nm to about 480 nm. Alternatively, the third section can allow the blue excitation light to pass through the patterned film of the quantum dot polymer composite, see below.

In another embodiment, a display device includes a light emitting element (e.g., a photoluminescent element) and optionally a light source, and the light emitting element includes a substrate and a light emitting layer disposed on the substrate, and the light emitting layer includes a film or patterned film of the quantum dot polymer composite. If present, the light source is configured to provide the light emitting element with incident light. The incident light may have a luminescence peak wavelength of greater than or equal to about 440 nm, for example, greater than or equal to about 450 nm, greater than or equal to about 455 nm, or greater than or equal to about 460 nm, and less than or equal to about 560 nm, less than or equal to about 500 nm, less than or equal to about 480 nm, less than or equal to about 470 nm, or less than or equal to about 460 nm.

In the light emitting layer (e.g., patterned film of quantum dot polymer composite) of the display device according to an embodiment, the first section may be a section emitting red light, and the second section may be a section emitting green light, and the light source may be an element emitting blue light and optionally green light.

The light source may be an element emitting an excitation light. The excitation light may include blue light and optionally green light. The light source may include an LED. The light source may include an organic LED (e.g. OLED). In an embodiment, on a front side (i.e. light emitting face) of the first section and the second section is disposed a first optical element cutting (e.g., absorbing or reflecting) blue light and optionally green light. The light source may include a blue light emitting OLED (organic light emitting diode) and a green light emitting OLED, and in this case, on the third section emitting or transmitting blue light is disposed an optical element that filters or removes green light In the aforementioned display device, the light source includes a plurality of light emitting units respectively corresponding to the first section and the second section, and the light emitting units may include a first electrode and a second electrode each having a surface opposite the other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are known but not particularly limited. The light source includes an organic light emitting diode (OLED) emitting blue light (and optionally, green light).

Figure 2:
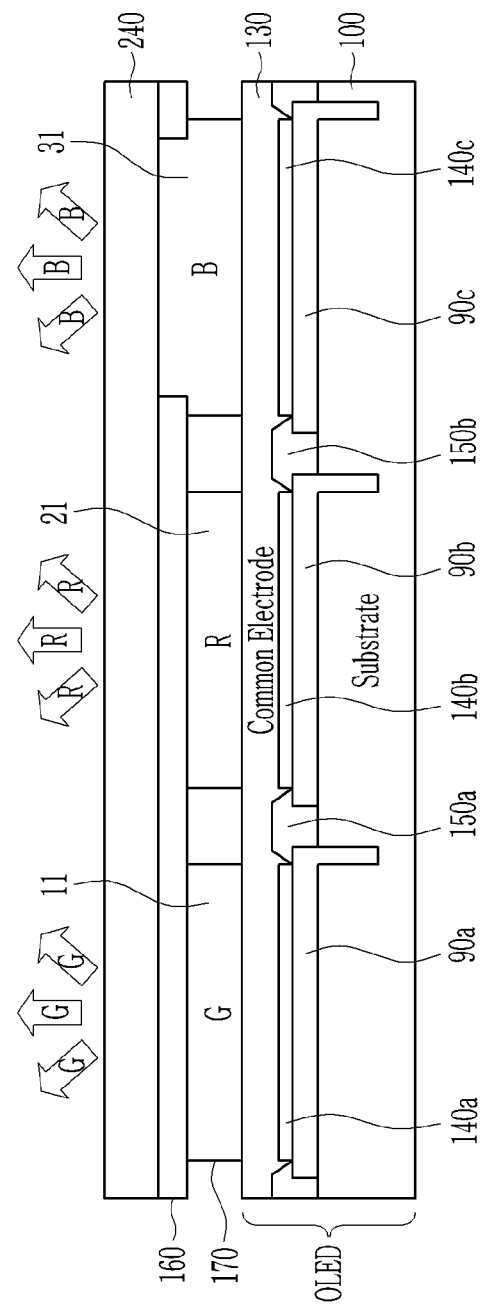
FIG. 2 is a schematic view showing a cross section of a display device according to an embodiment.

FIGS. 1 and 2 are schematic cross-sectional views of display devices according to embodiments. Referring to FIGS. 1 and 2, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode (layer) 130 formed on the organic light emitting layer 140a, 140b, 140c.

A thin film transistor and a substrate may be disposed under the organic light emitting diode (OLED).

A stacked structure including a quantum dot polymer composite pattern 170 (e.g., a section including red quantum dot and a section including green quantum dot) and a substrate may be disposed on the light source. The excitation light (e.g., blue light) emitted from the light source and incident upon the patterned sections is converted to red and green light, respectively. As above, blue light emitted from the light source may pass through the third section of the patterned quantum dot polymer composite.

Over the second section 21 emitting red light, the first section 11 emitting green light, or a combination thereof, an optical element 160 may be disposed. The optical element may be an excitation light cut layer or a first optical filter layer 310 (see FIG. 3), which cuts (e.g., reflects or absorbs) the excitation light (e.g., blue light, green light, or a combination thereof). The excitation light cut layer or optical element 160 may be disposed on the upper substrate 240. The excitation light cut layer 160 may be disposed under the upper substrate 240 (e.g., on a bottom surface of the upper substrate 240). The excitation light cut layer 160 may be disposed between the upper substrate 240 and the quantum dot polymer composite pattern and over the first section 11 and the second section 21 and if desired, the third section 31. Details of the excitation light cut layer are the same as set forth for the first optical filter below.

The device may be obtained by separately producing the aforementioned stacked structure and (e.g., blue light emitting) LED or OLED and then assembling the same. Alternatively, the display device may be obtained by forming a quantum dot polymer composite pattern directly on the LED or OLED.

The substrate may be a substrate including an insulating material. The substrate may include glass; various polymers such as polyester of polyethylene terephthalate (PET), or polyethylene naphthalate (PEN), polycarbonate, and polyacrylate; polysiloxane (e.g., PDMS); an inorganic material such as $Al_2O_3$ or ZnO; or a combination thereof, but is not limited thereto. A thickness of the substrate may be appropriately selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a gate electrode, a source electrode, a drain electrode, a semiconductor layer, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the aforementioned transparent conductive material and the aforementioned material having light-blocking properties are stacked sequentially.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode where is not covered by the pixel define layer may provide an opening. An organic light emitting layer that will be described later may be formed on the region defined by the opening.

The organic light emitting layer defines each pixel area by the aforementioned pixel electrode and pixel define layer. In other words, one pixel area may be defined as an area where is formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to a UV region. In other words, each of the first to the third pixel areas of the organic light emitting layer may emit third light. In an embodiment, the third light may be a light having the highest energy in the visible light region, for example, may be blue light. When all pixel areas of the organic light emitting layer are configured to emit the same light, each pixel area of the organic light emitting layer may be all formed of the same or similar materials or may show the same or similar properties. Such a design of the light emitting layer may significantly simplify the processes in forming the organic light emitting layer, and therefore, a display device may be easily applied to large scale/large area processing. However, the organic light emitting layer according to an embodiment is not necessarily limited thereto, but the organic light emitting layer may be configured to emit at least two different lights.

The organic light emitting layer includes an organic emission unit layer in each pixel area, and each organic emission unit layer may further include an auxiliary layer (e.g., hole injection layer (HIL), hole transport layer (HTL), electron transport layer (ETL), etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stacked structure and the lower substrate, and in the stacked structure, the light emitting layer may be disposed over a face of the liquid crystal layer. The display device may further include a polarizer between the liquid crystal layer and the light emitting layer. The light source may further include LED and if necessary, a light guide panel.

Figure 3:
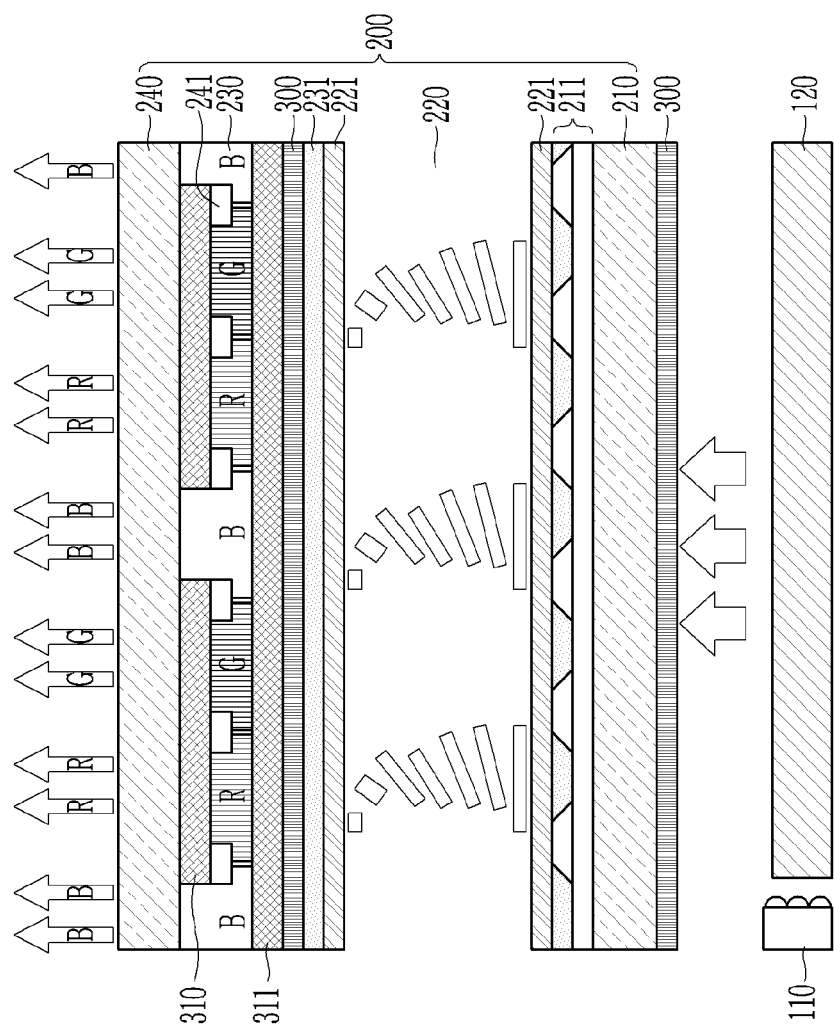
FIG. 3 is a schematic view showing a cross section of a display device according to an embodiment.

Non-limiting examples of the display device (e.g., a liquid crystal display device) according to an embodiment are illustrated with a reference to a drawing. FIG. 3 is a schematic cross-sectional view showing a liquid crystal display according to an embodiment. Referring to FIG. 3, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stacked structure, and a liquid crystal layer 220 disposed between the stacked structure and the lower substrate. The stacked structure includes a transparent substrate (or referred to as an upper substrate) 240 and a photoluminescent layer 230 including a pattern of a quantum dot polymer composite as described.

The lower substrate 210, also referred to as an array substrate, may be a transparent insulation material substrate. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal panel 200 may include an alignment layer 221 on the layer 220 to initially align the liquid crystal material. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer 300 may be disposed between the liquid crystal layer 220 and the light emitting layer 230. The polarizer may be any polarizer that used in a liquid crystal display device. The polarizer may be TAC (triacetyl cellulose) having a thickness of less than or equal to about 200 µm, but is not limited thereto. In another embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, and/or at least one optical sheet (not shown) on the light guide panel, for example, a diffusion plate, a prism sheet, and the like, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, a light guide panel, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If needed, the photoluminescent layer may further include at least one fourth section. The fourth section may include a quantum dot that emits different color from light emitted from the first to third sections (e.g., cyan, magenta, and yellow light).

In the light emitting layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as it is. If needed, the third section may include a quantum dot emitting blue light.

If needed, the display device may further have a blue light blocking layer (blue cut filter) or a first optical filter layer. The blue light blocking layer may be disposed between lower surfaces of the first section (R) and the second section (G) and the upper substrate 300 or on the upper surface of the upper substrate. The blue light blocking layer may be a sheet having an opening in a region corresponding to a pixel area (a third section) displaying blue and thus may be formed in a region corresponding first and second sections. As shown in FIG. 3, the first optical filter layer may be integrally formed as one body structure at the remaining positions except positions overlapped with the third section, but is not limited thereto. At least two first optical filter layers may be spaced apart and be disposed on each of the positions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

For example, the first optical filter layer may substantially block blue light having a wavelength of less than or equal to about 500 nm and may transmit light in other visible light wavelength region of greater than about 500 nm and less than or equal to about 700 nm.

For example, the first optical filter layer may have light transmittance of greater than or equal to about 70%, greater than or equal to about 80%, greater than or equal to about 90%, or even about 100% with respect to the other visible light of greater than about 500 nm and less than or equal to about 700 nm.

The first optical filter layer may include a polymer thin film including a dye and/or a pigment that absorbs light having a wavelength to be blocked. The first optical filter layer may block at least about 80%, or at least about 90%, even at least 95% of blue light having a wavelength of less than or equal to about 480 nm and it may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may block (e.g. absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include at least one of a first region and a second region wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or for example a layer having a high refractive index and a layer having a low refractive index may be alternately stacked with each other. As a refractive index difference between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, about 3 nm to about 10,000 nm, about 300 nm to about 10,000 nm, or about 1000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) disposed between the light emitting layer and the liquid crystal layer (e.g., between light emitting layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, it may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, it may be formed by alternately stacking two layers having different refractive indexes, or for example, it may be formed by alternately stacking material having a high refractive index and material having a low refractive index.

The layer having a high refractive index in the second optical filter layer may include, for example, at least one of hafnium oxide, tantalum oxide, titanium oxide, zirconium oxide, magnesium oxide, cesium oxide, lanthanum oxide, indium oxide, niobium oxide, aluminum oxide, and silicon nitride. According to embodiments, it may include a variety of materials having a higher refractive index than the layer having a low refractive index.

The layer having a low refractive index in the second optical filter layer may include, for example, a silicon oxide. According to embodiments, it may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10000 nm, about 300 nm to about 10000 nm, or about 1000 nm to about 10000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer 140 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus, the reflected green light and red light may pass through the first and the second sections to be emitted to the outside of the display device.

The second optical filter layer may reflect light in a wavelength region of greater than about 500 nm in greater than or equal to about 70%, greater than or equal to about 80%, or greater than or equal to about 90%, or even about 100%.

Meanwhile, the second optical filter layer may have a transmittance to light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In another embodiment, the aforementioned stacked structure may be produced by a method using the photoresist composition (e.g., the composition of an embodiment). The method may include forming a film of the aforementioned composition on a substrate;

exposing a selected region of the film to light (e.g., a wavelength of less than or equal to about 400 nm); and developing the exposed film with an alkali developing solution to obtain a pattern of the quantum dot polymer composite.

Figure 4:
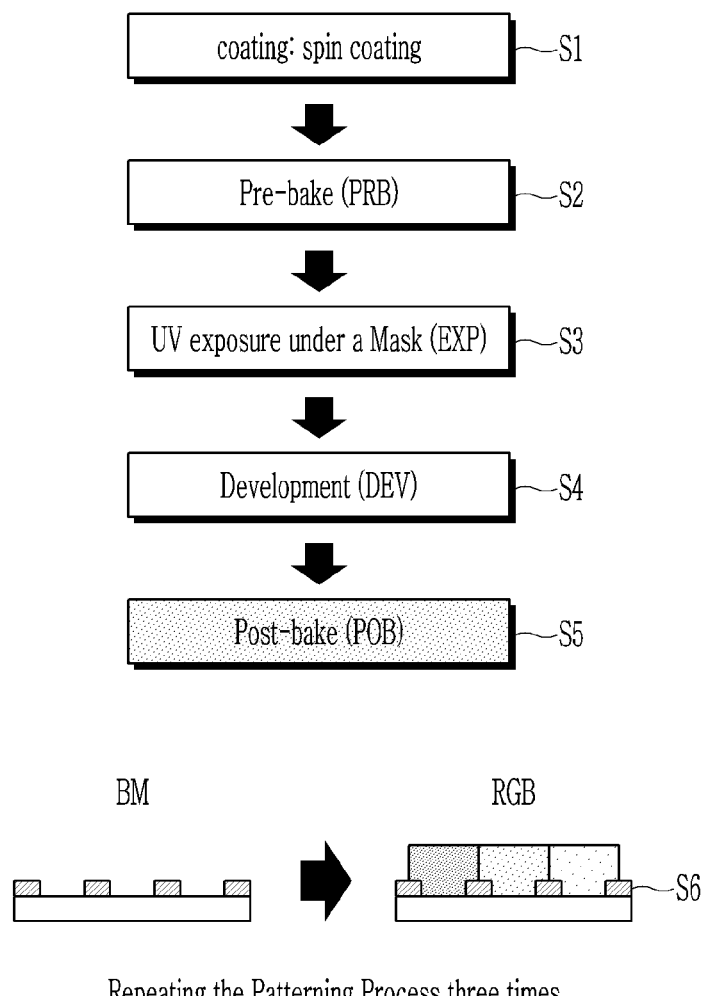
FIG. 4 schematically shows a pattern forming process using the composition according to an embodiment.

The substrate and the composition are the same as described above. Non-limiting methods of forming the aforementioned pattern are illustrated, referring to FIG. 4.

The aforementioned composition is coated to have a predetermined thickness on a substrate in an appropriate method of spin coating, slit coating, and the like (S1). The formed film may be, optionally, pre-baked (PRB) (S2). The pre-baking may be performed by appropriately selecting a condition from known conditions of a temperature, time, an atmosphere, and the like.

The formed (or optionally pre-baked) film is exposed to light having a predetermined wavelength under a mask having a predetermined pattern (S3). A wavelength and intensity of the light may be selected considering types and amounts of the photoinitiator, types and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5).

When the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and necessary times (e.g., twice or more or three times or more) repeating the aforementioned formation process of the aforementioned pattern about each composition (S6). For example, the quantum dot-polymer composite may have a pattern of at least two repetitive color sections (e.g., RGB color sections). This quantum dot-polymer composite pattern may be used as a photoluminescence-type color filter in a display device.

In another embodiment, the aforementioned stacked structure may be produced using an ink composition. The method may include depositing the same (e.g. to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

Another embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods

[1] UV-Vis Spectroscopy Analysis

UV-Vis spectroscopy is performed, and a UV-Visible absorption spectrum and its first derivative are obtained, using an Agilent Cary 5000 spectrophotometer

[2] Photoluminescence Analysis

A photoluminescence (PL) spectrum of a produced core shell quantum dot at an excitation wavelength of 450 nm is obtained using a Hitachi F-7000 spectrophotometer. The QY or QE of the quantum dot in solution or as a composite is measured according to the manual provided by the manufacturer of the spectrophotometer.

[3] ICP Analysis

An inductively coupled plasma-atomic emission spectroscopy (ICP-AES) is performed using Shimadzu ICPS-8100.

[4] Extinction Coefficient per gram of core shell quantum dot is determined as follows "a" liters of a quantum dot solution including quantum dots as prepared is diluted "n" times and is placed in a 1 cm quartz cuvette, and an Agilent Cary5000 spectrophotometer is used to perform a UV-VIS absorption analysis for this solution. From the obtained absorption spectrum, the absorbance (A) at 450 nm is determined. The quantum dot particles included in the quantum dot solution are washed and dried, and then, is weighed ("b" gram). The absorbance (A) is multiplied by the dilution ratio (n) and then, is divided by a concentration in grams per liter (g/L, i.e., b gram/a liter) of the quantum dot to obtain an extinction coefficient based on the following equation.

Absorbance=(extinction coefficient)*(light-passing length)*(concentration)

Extinction coefficient per gram=$A*n/(b/a)=A*n*a/b$

A: absorbance as measured
n: dilution ratio
a: volume (L) of the quantum dot solution before dilution
b: weight (g) of the quantum dots included in the quantum dot solution.

[5] Blue Light Absorption Rate and Light Conversion Rate (CE) of Composite

An integral hemisphere of an absolute quantum efficiency measurement equipment (QE-2100, Otsuka) is used to measure a light dose (B) of blue excitation light having a predetermined wavelength. Subsequently, a quantum dot polymer composite is put in the integral hemisphere and irradiated by the blue excitation light to measure a green light dose (A) and a blue light dose (B') irradiating out from the composite.

The measurements are used to obtain a blue light absorption rate and a light conversion rate according to the following equations.

Blue light absorption rate (%)=$[(B-B')B]\times100(\%)$

Light conversion rate(CE,%)=$[A/(B-B')]\times100(\%)$

Reference Example 1

Zinc acetate and oleic acid are dissolved in 1-octadecene in a 250 mL reaction flask and then, heated at 120° C. under vacuum and cooled down to room temperature to obtain a zinc oleate solution.

To the reaction flask, indium acetate and lauric acid are added, and the mixture is heated at 120° C. under vacuum. A mole ratio between zinc and oleic as used is 1:2, and a mole ratio of between indium and lauric acid as used is 1:3. After 1 hour, an atmosphere of the reaction flask is changed into nitrogen. While a temperature in the reaction flask increases to 250° C., and a mixed solution of tris(trimethylsilyl)phosphine ((TMSi)3P) and trioctylphosphine is rapidly injected into the reaction flask, and the reaction is monitored by taking a small reaction sample from the reaction flask, and then an UV-Vis absorption spectrum is taken of the sample. The reaction is allowed to continue until the absorption spectrum reaches a target wavelength. When the reaction is complete, the reaction solution is rapidly cooled down to room temperature. Acetone is added to facilitate formation of a precipitate, the precipitate is separated with a centrifuge, and the isolated precipitate is dispersed in toluene to prepare a toluene dispersion of the InZnP core.

The amounts of indium, zinc, and phosphorous used in the preparation have a mole ratio of 6:7:4.5. The absorption spectrum of the obtained InZnP core exhibits a first absorption wavelength of about 430 nm.

Example 1

[1] Quantum Dot Synthesis and Characteristic Analysis (1) Selenium is dispersed in trioctylphosphine to prepare a Se/TOP stock solution, and sulfur is dispersed in trioctylphosphine to prepare a S/TOP stock solution.

Zinc acetate and oleic acid are dissolved in trioctylamine in a 2 Liter (L) reaction flask, and the solution is vacuum-treated at 120° C. for 10 minutes. The reaction flask is filled with nitrogen ($N_2$), the solution is heated to 280° C. and then, cooled down to 100° C. The toluene dispersion of the InZnP semiconductor nanocrystal core prepared according to Reference Example 1 is added to the reaction flask, and the Se/TOP stock solution and dodecanethiol are injected at intervals several times into the reaction flask as the flask temperature is maintained at a reaction temperature of about 280° C. The resulting reaction solution includes particles including the InZnP core and a ZnSeS shell disposed on the core. A total reaction time is about 30 minutes.

In the preparation, a total amount of the Se and a total amount of the dodecanethiol (DDT) as used are 7 moles and 2 moles, per one mole of indium.

An ICP analysis of the synthesized core shell quantum dot is performed, and the first shell is shown to have a mole ratio of S:(S+Se) of about 0.17:1.

Then, the S/TOP stock solution is injected into the reaction mixture to conduct a reaction at the reaction temperature to obtain a reaction solution that includes a core shell quantum dot having a ZnS-second shell on the ZnSeS first shell. A total reaction time is 60 minutes, and a total amount of the sulfur as used is about 6 moles per 1 mole of indium.

The reaction mixture is cooled to room temperature and an excessive amount of ethanol is added to facilitate formation of the core shell quantum dot, which are then separated with a centrifuge. After the centrifugation, the supernatant is discarded and the precipitate is dried and then dispersed in toluene to obtain a toluene solution of quantum dot (hereinafter, a QD solution).

Figure 5:
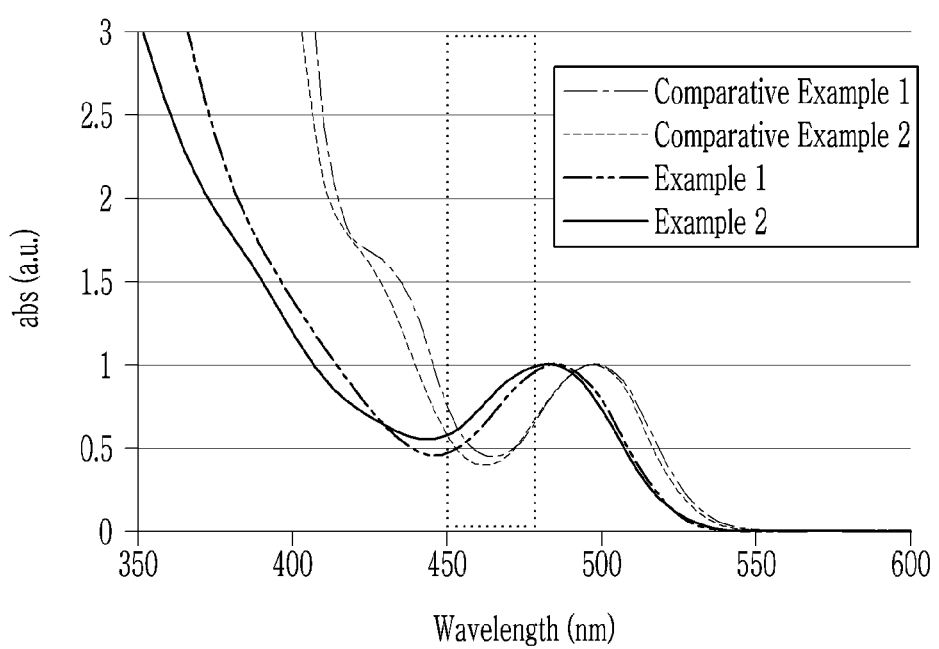
FIG. 5 shows UV-Vis absorption spectra of core shell quantum dots prepared according to Comparative Example 1 and Comparative Example 2 and Example 1 and Example 2.

(2) An ICP-AES of the obtained core shell QD is analyzed, and the result data is listed in Table 1. A UV-vis spectroscopy analysis and a photoluminescence analysis of the QD are performed. A portion of the spectroscopy results are shown in FIG. 5 and listed in Table 2. The obtained core shell QD has a quantum yield (QY) of 90.7%.

[2] Production of Quantum Dot-Polymer Composite and Pattern Thereof (1) Preparation of Quantum Dot-Binder Dispersion A toluene solution of the obtained quantum dot is mixed with a binder (a quaternary copolymer of methacrylic acid, benzyl methacrylate, hydroxyethyl methacrylate, and styrene, and having an acid value of 130 mg KOH/g, a molecular weight of 8000 grams per mole, a methacrylic acid:benzyl methacrylate:hydroxyethyl methacrylate:styrene (a mole ratio)=61.5%:12%:16.3%:10.2%) as a solution (polypropylene glycol monomethyl ether acetate (PGMEA) at a concentration of 30 wt %) to prepare a quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T), an oxime ester compound as an initiator, and TiO$_2$ as a light diffusing agent, and PGMEA to prepare a composition.

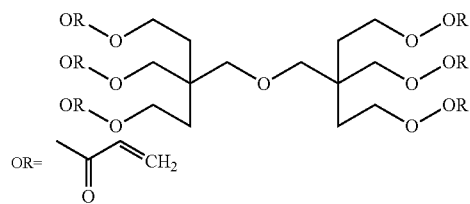

The prepared composition includes 40 wt % of the core shell quantum dots, 12.5 weight percent (wt %) of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

(3) Production of Quantum Dot-Polymer Composite Pattern and Heat Treatment

Each photosensitive composition is spin-coated on a glass substrate at 150 rpm for 5 seconds to obtain films. The films are pre-baked (PRB) at 100° C. These pre-baked films are exposed to irradiation of light (a wavelength: 365 nm, intensity: 100 mJ) for 1 second under a mask having a predetermined pattern (e.g., a square dot or a stripe pattern), and developed in a potassium hydroxide aqueous solution (a concentration: 0.043%) for 50 seconds to obtain quantum dot polymer composite patterns (a thickness: 6 um).

The obtained patterns are heat-treated (POB) at 180° C. for 30 minutes under a nitrogen atmosphere.

Blue light absorption rates of the obtained patterns are measured, and the results are shown in Table 3. The film patterns have photo-conversion efficiency of 33.8%.

Figure 6:
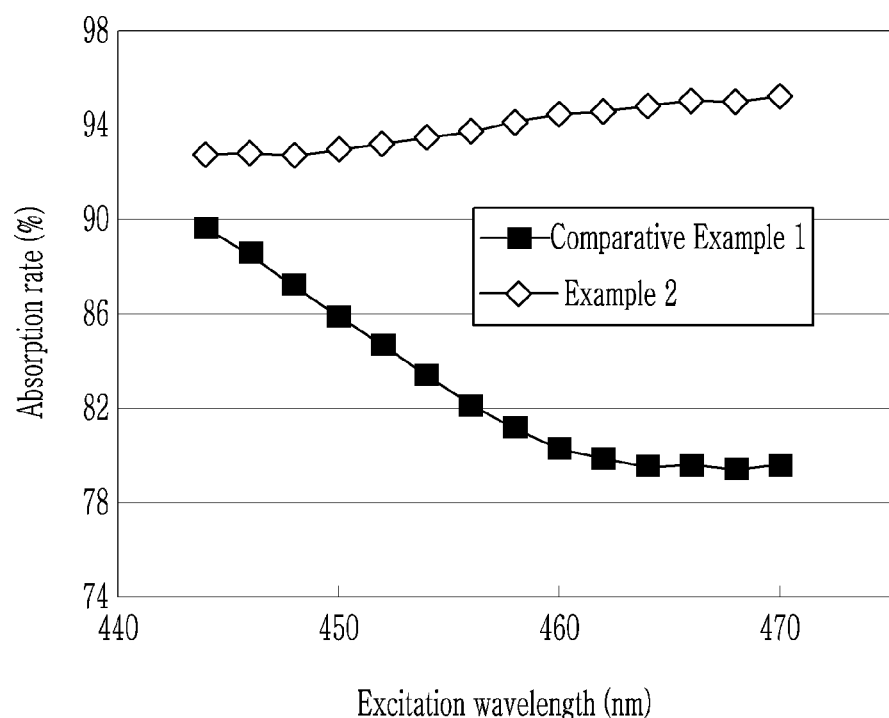
FIG. 6 is a graph showing absorption rate with a change in the excitation wavelength of the QD composites of Example 2 and Comparative Example 1.
Figure 7:
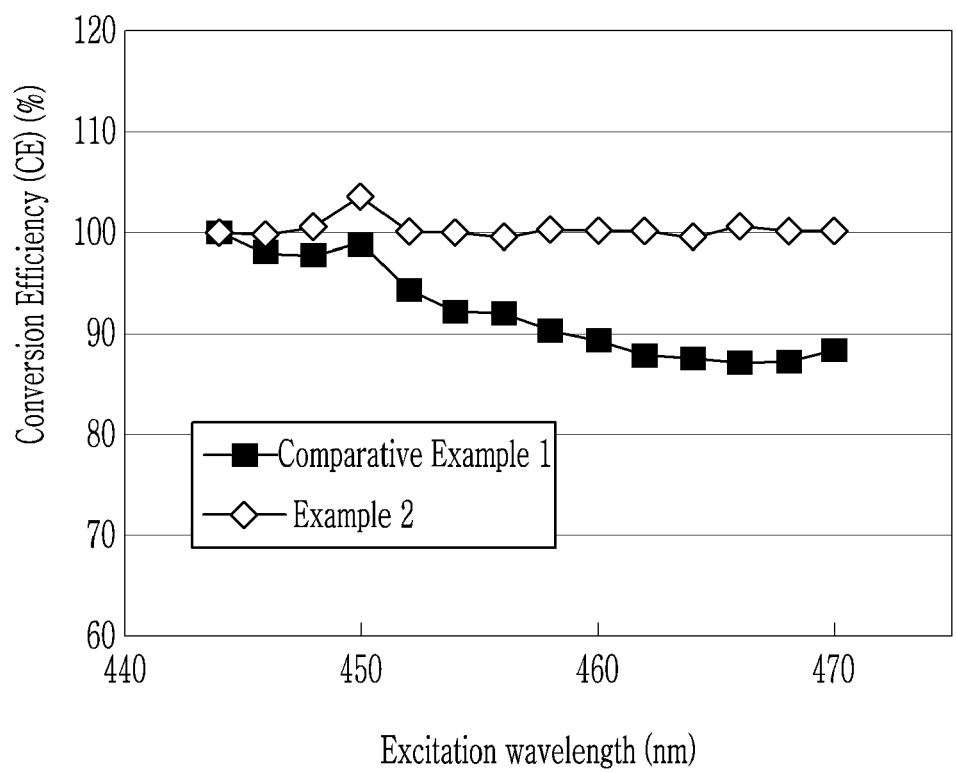
FIG. 7 is a graph showing changes in light conversion efficiency with a change in excitation wavelength of the QD composites of Example 2 and Comparative Example 1.

The excitation light absorption rate and relative light conversion efficiency are measured, as the excitation wavelength is varied, and the results are shown in the plots of FIGS. 6 and 7, respectively.

Example 2

[1] A core shell quantum dot having a structure of an InZnP core/a ZnSeS first shell/a ZnS-including second shell is obtained according to the same method as Example 1 except that based on 1 mole of indium, a total amount of selenium (Se/TOP stock solution) is 3 moles, and the total amount of dodecanethiol and S/TOP stock solution is 8 moles (Example 2).

As an ICP analysis result of the core shell quantum dot indicates a mole ratio of S:(S+Se) in the first shell is about 0.32:1.

An ICP-AES analysis, a UV-vis spectroscopy analysis, and a photoluminescence analysis of core shell QD are performed, and the results are shown in Tables 1 and 2 and the UV-vis spectra in FIG. 5. The obtained core shell QD has QY of 83.8%.

[2] A quantum dot-polymer composite pattern is obtained according to the same method as Example 1 except that the quantum dot of Example 2 is used. The obtained film pattern is measured with respect to a blue light absorption rate, and the result is shown in Table 3. Photo-conversion efficiency (CE) of the film pattern is 30.8%.

Comparative Examples 1 and 2

[1] Each comparative core shell quantum dot having a structure of an InZnP core/a ZnSeS first shell/a ZnS-including second shell is obtained according to the same method as Example 1 except that based on 1 mole of indium, the total amount of Se is 24 moles, and the total amount of dodecanethiol and the S/TOP stock solution is 20 moles (Comparative Example 1) and for Comparative Example 2, the total amount of Se is 21 moles, and the total amount of dodecanethiol and the S/TOP stock solution is 20 moles. The total reaction time is 160 minutes. An ICP-AES analysis, a UV-vis spectroscopy analysis, and a photoluminescence analysis of the obtained comparative core shell QDs are performed, and the results are shown in Tables 1 and 2, and the UV-vis spectra in FIG. 5.

[2] Comparative quantum dot-polymer composite patterns are obtained according to the same method as Example 1 except that the comparative core shell quantum dots are used. The obtained film patterns are measured with respect to a blue light absorption rate, and the results are shown in Table 3.

The film pattern including the quantum dot of Comparative Example 1 is measured with respect to absorption rate and relative CE (%) with varying excitation wavelength and the results are shown in FIGS. 6 and 7, respectively.

TABLE 1

| | In/(S + Se) | S:Se | Zn:In | P:In | Total shell thickness (monolayers, ML) |
|---|---|---|---|---|---|
| Example 1 | 0.072 | 0.96:1 | 17.7:1 | 0.94:1 | 4.3 |
| Example 2 | 0.105 | 1.97:1 | 13.3:1 | 0.92:1 | 3.5 |
| Comparative Example 1 | 0.028 | 0.50:1 | 43.6:1 | 0.97:1 | 7 |
| Comparative Example 2 | 0.032 | 0.52:1 | 37.9:1 | 0.90:1 | 6.7 |

TABLE 2

| | First absorption wavelength (nm) | Differential coefficient at 450 nm | PL wavelength (nm) | Extinction coefficient per QD weight @450 (/g) |
|---|---|---|---|---|
| Comparative Example 1 | 498 | −0.043 | 522 | 0.28 |
| Comparative Example 2 | 497 | −0.032 | 520 | N.A |
| Example 1 | 486 | 0.0066 | 507 | 0.38 |
| Example 2 | 483 | 0.0085 | 509 | 0.43 |

TABLE 3

| | Composite film Wavelength (nm) | Absorption rate |
|---|---|---|
| Comparative Example 1 | 534.3 | 87.8% |
| Comparative Example 2 | 532.8 | 85.8% |
| Example 1 | 532.3 | 91.1% |
| Example 2 | 535.8 | 93.7% |

Referring to the results of Table 2, the quantum dot of Examples 1 and 2 exhibit a positive differential coefficient at 450 nm whereas the quantum dot of comparative examples 1 and 2 exhibit negative differential coefficients at 450 nm.

Referring to the results of Table 3, the quantum dot polymer composites of Examples 1 and 2 exhibit a greater absorption rate than the quantum dot polymer composites of comparative examples 1 and 2.

Examples 3 and 4

[1] Each core shell quantum dot having a structure of an {InZnP core/a ZnSeS first shell/a ZnS second shell} is obtained according to the same method as Example 1 except that based on 1 mole of indium, the total amount of Se is 4 moles and the total amount of dodecanethiol and S/TOP stock solution is 8 moles (Example 3), and for Example 4, the total amount of Se is 4 moles and the total amount of dodecanethiol and S/TOP stock solution is 14 moles. An ICP-AES analysis, a UV-Vis spectroscopy analysis, and a photoluminescence analysis of the obtained core shell QD of Examples 3 and 4 are performed, and the results are shown in Tables 4 and 5.

[2] Each quantum dot-polymer composite pattern is obtained according to the same method as Example 1 except that the obtained quantum dots of Examples 3 and 4 are used. A photo-conversion efficiency of the obtained film patterns is measured, and the results are shown in Table 6.

An extinction coefficient per gram of the quantum dots of Examples 3 and 4 is greater than 0.35. Absorption rates of the quantum dot polymer composite single films respectively including the quantum dots according to Examples 3 and 4 are respectively 93% and 92.4%.

Comparative Examples 3 and 4

[1] Each core shell quantum dot having a structure of an {InZnP core/a ZnSe or a ZnSeS first shell/a ZnS second shell} is obtained except that based on 1 mole of indium, the total amount of Se is 4 moles, and the total amount of S/TOP stock solution without using dodecanethiol is 9 moles (Comparative Example 3), and for Comparative Example 4, based on 1 mole of indium, the total amount of Se is 1 mole and the total amount of dodecanethiol and S/TOP stock solution is 10 moles. An ICP-AES analysis, a UV-vis spectroscopy analysis, a photoluminescence analysis of the obtained core shell quantum dots of Comparative Examples 3 and 4 are performed, and the results are shown in Tables 4 and 5.

[2] Each quantum dot-polymer composite pattern is obtained according to the same method as Example 1 except that the obtained core shell quantum dots of Comparative Examples 3 and 4 are used. A photo-conversion efficiency of the obtained film patterns is measured, and the results are shown in Table 6.

TABLE 4

| | In/(S + Se) | S:Se | Zn:In | P:In | Total shell thickness (ML) |
|---|---|---|---|---|---|
| Example 3 | 0.093 | 2.18:1 | 14.9:1 | 0.97:1 | 3.8 |
| Example 4 | 0.072 | 2.94:1 | 17.7:1 | 0.87:1 | 4.3 |
| Comparative Example 3 | 0.085 | 2.03:1 | 16.52 | 0.91:1 | 3.9 |
| Comparative Example 4 | 0.102 | 8.40:1 | 14.2:1 | 0.99:1 | 3.9 |

TABLE 5

| | First absorption wavelength (nm) | Differential coefficient at 450 nm | PL wavelength (nm) | QY (%) |
|---|---|---|---|---|
| Example 3 | 483 | 0.0073 | 506 | 83.1 |
| Example 4 | 481 | 0.0092 | 506 | 81.9 |
| Comparative Example 3 | 488 | 0.0000 | 509 | 73.7 |

TABLE 5-continued

| | First absorption wavelength (nm) | Differential coefficient at 450 nm | PL wavelength (nm) | QY (%) |
|---|---|---|---|---|
| Comparative Example 4 | 485 | 0.0029 | 509 | 77.0 |

TABLE 6

| | Composite film wavelength(nm) | Composite film (pattern) CE |
|---|---|---|
| Example 3 | 534.9 | 31.9% |
| Example 4 | 533.2 | 30.8% |
| Comparative Example 3 | 531.7 | 24.6% |
| Comparative Example 4 | 546.2 | 25.2% |

Referring to the results of Table 5, when the quantum dots of Examples 3 and 4 are used to provide single films, the films exhibit higher light conversion efficiency and higher quantum yields both of which demonstrate improved luminous efficiency.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A core shell quantum dot comprising: a semiconductor nanocrystal core comprising indium and phosphorus, and a semiconductor nanocrystal shell disposed on the semiconductor nanocrystal core, the semiconductor nanocrystal shell comprising zinc, selenium, and sulfur,
wherein the core shell quantum dot does not comprise cadmium, and
wherein the core shell quantum dot has a mole ratio sulfur to selenium of greater than or equal to about 0.05:1 to less than or equal to about 3.5:1, and a mole ratio of zinc to indium of greater than or equal to about 10:1 and less than or equal to about 24:1.

2. The core shell quantum dot of claim 1, wherein the core shell quantum dot has a valley depth defined by the following equation of greater than or equal to about 0.4:

$$1-(Abs_{valley}/Abs_{first})=VD$$

wherein, $Abs_{first}$ is an absorption rate at the first absorption peak, and $Abs_{valley}$ is an absorption rate at the lowest point of the valley adjacent to the first absorption peak.

3. The core shell quantum dot of claim 1, wherein the core shell quantum dot has a mole ratio of sulfur to selenium of great than or equal to about 0.1:1 and less than or equal to about 2.4:1.

4. The core shell quantum dot of claim 1, wherein the core shell quantum dot has a mole ratio of indium with respect to a total sum of sulfur and selenium is greater than or equal to 0.05:1 and less than or equal to 0.15:1.

5. The core shell quantum dot of claim 1, wherein the core shell quantum dot has a mole ratio of zinc to indium of greater than or equal to about 13:1 and less than or equal to about 18:1.

6. The core shell quantum dot of claim 1, wherein the core shell quantum dot has a mole ratio of phosphorus to indium of greater than or equal to about 0.7:1 and less than or equal to about 1.5:1.

7. The core shell quantum dot of claim 1, wherein the core shell quantum dot is configured to emit green light; and
wherein a maximum peak emission wavelength of the green light is greater than or equal to about 500 nanometers and less than or equal to about 530 nm.

8. The core shell quantum dot of claim 1, wherein the core shell quantum dot has a quantum efficiency of greater than or equal to about 85%.

9. The core shell quantum dot of claim 1, wherein the shell comprises a first semiconductor nanocrystal shell disposed on the semiconductor nanocrystal core and comprising zinc, selenium, and sulfur, and a second semiconductor nanocrystal shell disposed on the first semiconductor nanocrystal shell and comprising zinc and sulfur.

10. The core shell quantum dot of claim 9, wherein in the first semiconductor nanocrystal shell, a mole ratio of sulfur to a sum of selenium and sulfur is greater than or equal to about 0.1:1 and less than or equal to about 0.7:1.

11. The core shell quantum dot of claim 1, wherein an ultraviolet-visible absorption spectrum curve of the core shell quantum dot has a positive differential coefficient value at 450 nanometers.

12. The core shell quantum dot of claim 1, wherein the semiconductor nanocrystal core further comprises zinc.

13. The core shell quantum dot of claim 1, wherein the core shell quantum dot has a quantum efficiency of greater than or equal to about 80%.

14. A display device comprising a photoluminescent element comprising a substrate and a light emitting layer disposed on the substrate,
wherein the light emitting layer comprises a first section and a second section, the first section being configured to emit first light and the second section being configured to emit second light different from the first light,
wherein the first section comprises a first quantum dot polymer composite,
wherein the quantum dot polymer composite comprises a polymer matrix; and a core shell quantum dot dispersed in the polymer matrix, and
where the core shell quantum dot comprises: a semiconductor nanocrystal core comprising indium and phosphorus, and a semiconductor nanocrystal shell disposed on the semiconductor nanocrystal core, the semiconductor nanocrystal shell comprising zinc, selenium, and sulfur,
wherein the core shell quantum dot has a mole ratio of sulfur to selenium of greater than or equal to about 0.05:1 to less than or equal to about 3.5:1, and a mole ratio of zinc to indium of greater than or equal to about 10:1 and less than or equal to about 24:1,
wherein the core shell quantum dot does not comprise cadmium.

15. The display device of claim 14, wherein the core shell quantum dot has a mole ratio of sulfur to selenium of greater than or equal to about 0.1:1 and less than or equal to about 2.4:1 and wherein the core shell quantum dot has a mole ratio of zinc to indium of greater than or equal to about 13:1 and less than or equal to about 18:1.

16. The display device of claim 14, wherein the light emitting layer further comprises a third section being configured to emit or transmit blue light, and
wherein the first light is green light having a maximum photoluminescence peak wavelength that is between about 500 nm and about 550 nm and the second light is red light having a maximum photoluminescence peak wavelength that is between about 600 nm and about 650 nm.

17. The display device of claim 14, wherein the display device further comprises a light source being configured to provide the light emitting element with an incident light, wherein the incident light has a luminescent peak wavelength of greater than or equal to about 440 nm and less than or equal to about 560 nm,
wherein the light source comprises a plurality of light emitting units respectively corresponding to the first section and the second section, and the light emitting unit comprises an organic light emitting diode.

18. The display device of claim 14, wherein the organic light emitting diode emits a blue light and optionally a green light.

19. The display device of claim 14, wherein the light emitting layer further comprises a third section being configured to emit or transmit blue light, and wherein the display device further comprise an optical element disposed on the first section, the second section and optionally the third section, and the optical element is configured to cut an incident light.

* * * * *